(12) United States Patent
Noguchi

(10) Patent No.: US 12,712,525 B2
(45) Date of Patent: Aug. 18, 2026

(54) ACOUSTIC WAVE FILTER DEVICE

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 231 days.

(21) Appl. No.: 18/604,619

(22) Filed: Mar. 14, 2024

(65) Prior Publication Data

US 2024/0348233 A1 Oct. 17, 2024

(30) Foreign Application Priority Data

Apr. 12, 2023 (JP) ................................ 2023-065070

(51) Int. Cl.
*H03H 9/64* (2006.01)
*H03H 9/02* (2006.01)
*H03H 9/25* (2006.01)

(52) U.S. Cl.
CPC ...... *H03H 9/6483* (2013.01); *H03H 9/02015* (2013.01); *H03H 9/02992* (2013.01); *H03H 9/25* (2013.01)

(58) Field of Classification Search
CPC ............ H03H 9/6483; H03H 9/02015; H03H 9/02992; H03H 9/25
See application file for complete search history.

(56) References Cited

U.S. PATENT DOCUMENTS

2016/0065176 A1 3/2016 Taniguchi et al.
2017/0093372 A1* 3/2017 Yokoyama ........... H03H 9/6423
2020/0304092 A1* 9/2020 Suzuki ................. H03H 9/1457
2022/0116021 A1* 4/2022 Yokoyama .............. H03H 9/13

FOREIGN PATENT DOCUMENTS

WO 2014/192755 A1 12/2014

* cited by examiner

*Primary Examiner* — Samuel S Outten
(74) *Attorney, Agent, or Firm* — Keating & Bennett, LLP

(57) ABSTRACT

In a plan view in a thickness direction of a piezoelectric substrate, each of acoustic wave resonators includes a central region, a first region having a lower acoustic wave velocity than that of the central region, and a second region having a lower acoustic wave velocity than that of the central region. A first acoustic wave resonator includes a third region having a gap of about 0.3λ or longer in a predetermined direction outside of the first region and having a higher acoustic velocity of the acoustic wave than that of the central region, and a fourth region having a gap of about 0.3λ or longer in the predetermined direction outside of the second region and having a higher acoustic velocity of the acoustic wave than that of the central region. A second acoustic wave resonator does not include the third and fourth regions.

19 Claims, 15 Drawing Sheets

2
201
4
42
14
3
11
10
ACOUSTIC VELOCITY
40
A10
43
A8
32
41
A4
A6
9
A2
71
30
300
6
7
A0
D1
61
8
A1
X1
A3
A5
31
51
A7
53
50
A9
52
D2
5

12
X2

3 6 7 6 7 11 6 7 8 201 10 214 213 212 211 D0 2 202 D2

ACOUSTIC VELOCITY
A10
A8
A6
A4
A2
A0
A1
A3
A5
A7
A9
D1
D2
X1

ACOUSTIC VELOCITY
A6
A4
A2
A0
A1
A3
A5
D1
D2
X2

2
201
4
42
14
3
11
10
ACOUSTIC VELOCITY
A10
40
43
41a
41
A8
A6
A4
32
9
A2
71
6
7
30
300
A0
D1
61
8
A1
X1
A3
A5
31
51a
51
A7
53
50
A9
52
D2
5

12
X2

2
201
4
14
3
11
10
ACOUSTIC VELOCITY
A10
40
A8
9
A2
71
6
30
300
7
A0
D1
61
8
A1
X1
A7
50
A9
5
D2

2
201
4
3
14
12
10
ACOUSTIC VELOCITY
32
A4
A6
A2
9
71
6
7
A0
D1
61
8
A1
X2
A3
31
A5
5
D2

2
201
4
42
14A
3
11A
10
ACOUSTIC VELOCITY
40
40
A10
A10
43
43
43
A8
A8
32
41
A6
A6
A4
A4
A2
A2
71
72
6
30
300
6
7
6
7
A0
7
D1
A0
62
61
X1
X1
A1
A1
A3
A3
A5
A5
31
51
53
53
A7
53
A7
50
A9
50
A9
52
D2
5

2
201
4
3
14A
12A
10
ACOUSTIC VELOCITY
32
A6
A6
A4
A4
A2
A2
71
72
6
6
30
300
7
6
7
A0
7
D1
A0
62
61
X2
X2
A1
A1
A3
A3
31
A5
A5
5
D2

2
201
4
42
14B
3
11B
10
ACOUSTIC VELOCITY
40
A10
43
32
41
A8
A6
A4
9
A2
71
72
6
7
30
300
A0
D1
62
61
8
X1
A1
A3
A5
31
51
53
A7
50
A9
52
D2
5

12B
A5

ACOUSTIC WAVE FILTER DEVICE

CROSS REFERENCE TO RELATED APPLICATIONS

This application claims the benefit of priority to Japanese Patent Application No. 2023-065070 filed on Apr. 12, 2023. The entire contents of this application are hereby incorporated herein by reference.

BACKGROUND OF THE INVENTION

1. Field of the Invention

The present invention generally relates to acoustic wave filter devices, and more specifically, relates to acoustic wave filter devices each including a plurality of acoustic wave resonators.

2. Description of the Related Art

International Publication No. 2014/192755 discloses an acoustic wave filter device including a plurality of acoustic wave resonators.

In the acoustic wave filter device disclosed in International Publication No. 2014/192755, each of the acoustic wave resonators has a piezoelectric substrate and an IDT electrode formed on the piezoelectric substrate. The IDT electrode includes a first busbar, a second busbar disposed to be separated from the first busbar, a plurality of first electrode fingers having a base end electrically connected to the first busbar and extending toward the second busbar, and a plurality of second electrode fingers having a base end connected to the second busbar and extending toward the first busbar.

When an extending direction of the first and second electrode fingers of the IDT electrode is defined as a width direction of the IDT electrode, the IDT electrode is configured to have a central region at a center in the width direction, a low acoustic velocity region outside of the central region, and a high acoustic velocity region further outside of the central region.

The acoustic wave filter device disclosed in International Publication No. 2014/192755 can suppress transverse mode ripple.

SUMMARY OF THE INVENTION

In some cases, it is desirable to reduce a size of an acoustic wave filter device.

Accordingly, example embodiments of the present invention provide acoustic wave filter devices that each achieve both characteristics and size reduction.

According to an aspect of an example embodiment of the present invention, an acoustic wave filter device includes plurality of acoustic wave resonators. Each of the plurality of acoustic wave resonators includes a piezoelectric substrate and an IDT electrode. The IDT electrode is provided on the piezoelectric substrate. The IDT electrode includes a first busbar, a second busbar, a plurality of first electrode fingers, and a plurality of second electrode fingers. The second busbar faces the first busbar in a predetermined direction. The plurality of first electrode fingers extend from the first busbar toward the second busbar in the predetermined direction. The plurality of second electrode fingers extend from the second busbar toward the first busbar in the predetermined direction. A region between an envelope of tip edges of the plurality of first electrode fingers and an envelope of tip edges of the plurality of second electrode fingers is defined as an intersecting region, and a wavelength of an acoustic wave determined by an electrode finger pitch of the IDT electrode is defined as A. In a plan view in a thickness direction of the piezoelectric substrate, each of the plurality of acoustic wave resonators includes a central region, a first region, and a second region. The central region includes a central portion of the intersecting region of the IDT electrode in the predetermined direction. The first region includes tip end portions of the plurality of first electrode fingers, and has a lower acoustic velocity of an acoustic wave than that of the central region. The second region includes tip end portions of the plurality of second electrode fingers, and has a lower acoustic velocity of an acoustic wave than that of the central region. The plurality of acoustic wave resonators include a first acoustic wave resonator and a second acoustic wave resonator. The piezoelectric substrate of the first acoustic wave resonator and the piezoelectric substrate of the second acoustic wave resonator are the same. The first acoustic wave resonator further includes a third region and a fourth region. The third region has a gap having a length of about 0.3λ or longer in the predetermined direction outside of the first region in the predetermined direction, and has a higher acoustic velocity of an acoustic wave than that of the central region. The fourth region has a gap having a length of about 0.3λ or longer in the predetermined direction outside of the second region in the predetermined direction, and has a higher acoustic velocity of an acoustic wave than that of the central region. The second acoustic wave resonator does not include the third region and the fourth region.

According to another aspect of an example embodiment of the present invention, an acoustic wave filter device includes a plurality of acoustic wave resonators. Each of the plurality of acoustic wave resonators includes a piezoelectric substrate and an IDT electrode. The IDT electrode is provided on the piezoelectric substrate. The IDT electrode includes a first busbar, a second busbar, a plurality of first electrode fingers, and a plurality of second electrode fingers. The second busbar faces the first busbar in a predetermined direction. The plurality of first electrode fingers extend from the first busbar toward the second busbar in the predetermined direction. The plurality of second electrode fingers extend from the second busbar toward the first busbar in the predetermined direction. A region between an envelope of tip edges of the plurality of first electrode fingers and an envelope of tip edges of the plurality of second electrode fingers is defined as an intersecting region, and a wavelength of an acoustic wave determined by an electrode finger pitch of the IDT electrode is defined as A. In a plan view in a thickness direction of the piezoelectric substrate, each of the plurality of acoustic wave resonators includes a central region, a first region, and a second region. The central region includes a central portion of the intersecting region of the IDT electrode in the predetermined direction. The central region includes a central portion of the intersecting region of the IDT electrode in the predetermined direction. The first region includes tip end portions of the plurality of first electrode fingers, and includes a first mass addition film overlapping at least a portion of the tip end portion of at least one first electrode finger in the plurality of first electrode fingers. The second region includes tip end portions of the plurality of second electrode fingers, and includes a second mass addition film overlapping at least a portion of the tip end portion of at least one second electrode finger in the plurality of second electrode fingers. The tip end portion of the plurality of first electrode fingers is a portion including a tip edge of the first electrode fingers. The tip end portion of the plurality of second electrode fingers is a portion including a tip edge of the second electrode fingers. The plurality of acoustic wave resonators include a first acoustic wave resonator and a second acoustic wave resonator. The piezoelectric substrate of the first acoustic wave resonator and the piezoelectric substrate of the second acoustic wave resonator are the same. The first acoustic wave resonator further includes a third region and a fourth region. The third region has a gap having a length of about 0.3λ or longer in the predetermined direction outside of the first region in the predetermined direction. The fourth region has a gap having a length of about 0.3λ or longer in the predetermined direction outside of the second region in the predetermined direction. The second acoustic wave resonator does not include the third region and the fourth region.

According to still another aspect of an example embodiment of the present invention, an acoustic wave filter device includes a plurality of acoustic wave resonators. Each of the plurality of acoustic wave resonators includes a piezoelectric substrate and an IDT electrode. The IDT electrode is provided on the piezoelectric substrate. The IDT electrode includes a first busbar, a second busbar, a plurality of first electrode fingers, and a plurality of second electrode fingers. The second busbar faces the first busbar in a predetermined direction. The plurality of first electrode fingers extend from the first busbar toward the second busbar in the predetermined direction. The plurality of second electrode fingers extend from the second busbar toward the first busbar in the predetermined direction. A region between an envelope of tip edges of the plurality of first electrode fingers and an envelope of tip edges of the plurality of second electrode fingers is defined as an intersecting region, and a wavelength of an acoustic wave determined by an electrode finger pitch of the IDT electrode is defined as λ. In a plan view in a thickness direction of the piezoelectric substrate, each of the plurality of acoustic wave resonators includes a central region, a first region, and a second region. The central region includes a central portion of the intersecting region of the IDT electrode in the predetermined direction. The first region includes tip end portions of the plurality of first electrode fingers, and the tip end portion of at least one first electrode finger in the plurality of first electrode fingers includes a first wide portion. The second region includes tip end portions of the plurality of second electrode fingers, and the tip end portion of at least one second electrode finger in the plurality of second electrode fingers includes a second wide portion. A width of the first wide portion is wider than a width of the central portion of the at least one first electrode finger. A width of the second wide portion is wider than a width of the central portion of the at least one second electrode finger. The plurality of acoustic wave resonators include a first acoustic wave resonator and a second acoustic wave resonator. The piezoelectric substrate of the first acoustic wave resonator and the piezoelectric substrate of the second acoustic wave resonator are the same. The first acoustic wave resonator further includes a third region and a fourth region. The third region has a gap having a length of about 0.3λ or longer in the predetermined direction outside of the first region in the predetermined direction. The fourth region has a gap having a length of about 0.3λ or longer in the predetermined direction outside of the second region in the predetermined direction. The second acoustic wave resonator does not include the third region and the fourth region.

The acoustic wave filter devices according to the above-described aspects of example embodiments of the present invention can achieve both characteristics and size reduction. The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
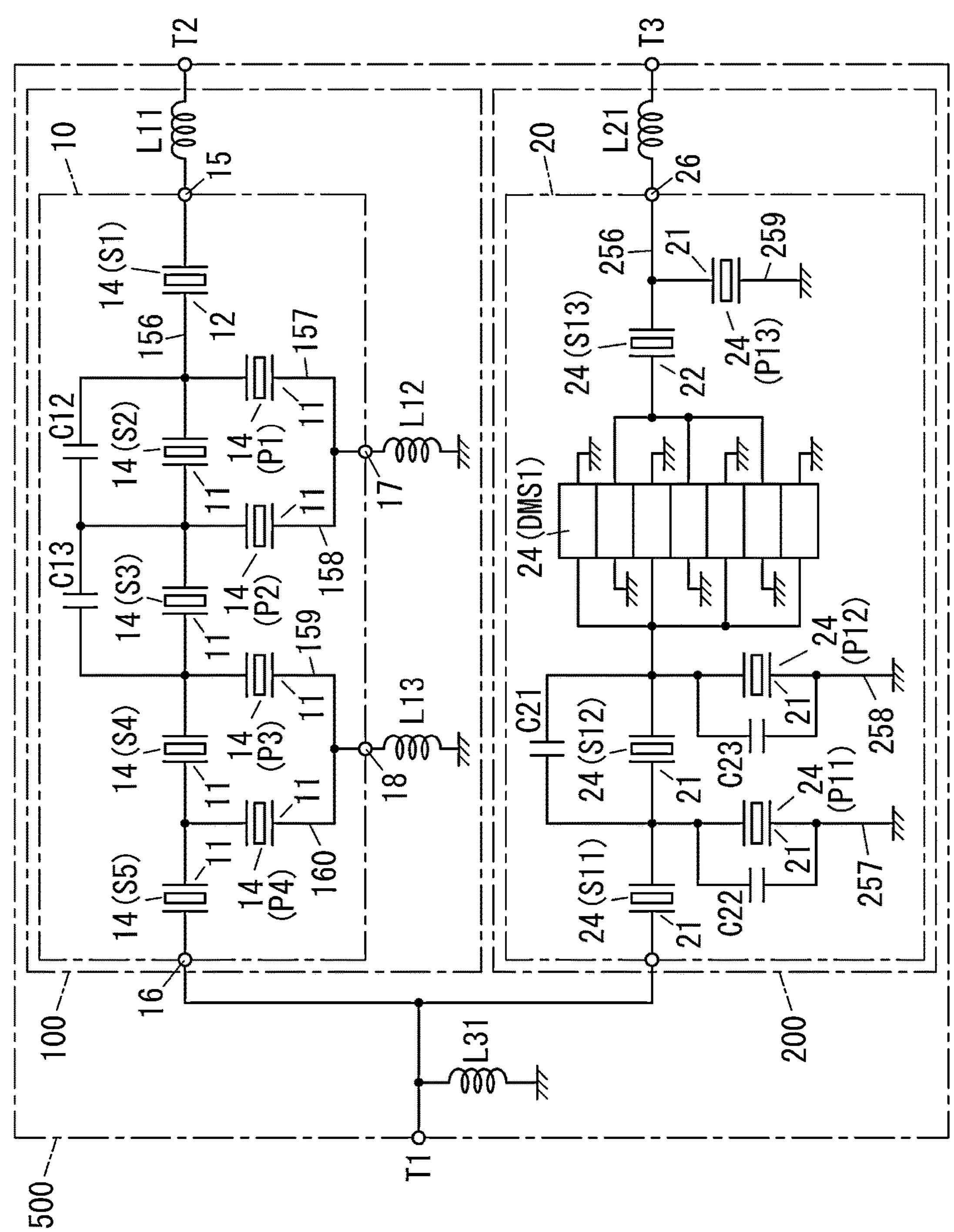
FIG. 1 is a circuit diagram of a high frequency module including an acoustic wave filter device according to Example Embodiment 1 of the present invention.

Hereinafter, Example Embodiments 1 to 5 will be described with reference to the drawings. The drawings referred to in, for example, the following example embodiments are schematic views, and a size and a thickness of each component in the drawings do not necessarily reflect actual dimensions, and a size ratio and a thickness ratio between the components do not necessarily reflect the actual dimensional ratios.

Example Embodiment 1

(1) Acoustic Wave Filter Device and High Frequency Module

An acoustic wave filter device 100 and a high frequency module 500 according to Example Embodiment 1 will be described with reference to the drawings.

For example, the high frequency module 500 is used in a communication device. For example, the communication device is a mobile phone (for example, a smart phone). Meanwhile, without being limited thereto, for example, the communication device may be a wearable terminal (for example, a smart watch). For example, the high frequency module 500 is a module which can correspond to a fourth generation mobile communication (4G) standard and a fifth generation mobile communication (5G) standard. For example, the 4G standard is a third generation partnership project (3GPP: registered trademark) long term evolution (LTE: registered trademark) standard. For example, the 5G standard is 5G new radio (NR).

A high frequency module 500 according to Example Embodiment 1 includes a first signal terminal T1, a second signal terminal T2, and an acoustic wave filter device 100, as shown in FIG. 1. The acoustic wave filter device 100 includes a plurality of (nine in an example in FIG. 1) acoustic wave resonators 14. In addition, the acoustic wave filter device 100 further includes a plurality of (two in the example in FIG. 1) capacitors C12 and C13 and a plurality of (three in the example in FIG. 1) inductors L11 to L13.

In the high frequency module 500, the acoustic wave filter device 100 is connected between the first signal terminal T1 and the second signal terminal T2. The first acoustic wave filter device 100 is a transmitting filter. For example, the first signal terminal T1 is connected to an antenna of a communication device including the high frequency module 500. For example, the second signal terminal T2 is connected to a power amplifier of the communication device.

In addition, the high frequency module 500 further includes a third signal terminal T3 and an acoustic wave filter device 200 (hereinafter, also referred to as a second acoustic wave filter device 200) different from the acoustic wave filter device 100 (hereinafter, also referred to as a first acoustic wave filter device 100). The second acoustic wave filter device 200 includes a plurality of (seven in the example in FIG. 1) acoustic wave resonators 24. In addition, the second acoustic wave filter device 200 further includes a plurality of (three in the example in FIG. 1) capacitors C21 to C23 and one inductor L21.

In the high frequency module 500, the second acoustic wave filter device 200 is connected between the first signal terminal T1 and the third signal terminal T3. For example, the third signal terminal T3 is connected to a low noise amplifier of the communication device. The second acoustic wave filter device 200 is a receiving filter.

In addition, the high frequency module 500 further includes an inductor L31 connected between a common path for the first signal terminal T1, the first acoustic wave filter device 100, and the second acoustic wave filter device 200, and a ground. The inductor L31 has a function of performing impedance matching between the first acoustic wave filter device 100 and the second acoustic wave filter device 200, and the first signal terminal T1.

(2) Circuit Configuration of First Acoustic Wave Filter Device and Second Acoustic Wave Filter Device Hereinafter, circuit configurations of the first acoustic wave filter device 100 and the second acoustic wave filter device 200 according to Example Embodiment 1 will be described with reference to the drawings.

(2.1) Circuit Configuration of First Acoustic Wave Filter Device

As shown in FIG. 1, the first acoustic wave filter device 100 is a ladder filter, and includes a plurality of (nine in the example in FIG. 1) of acoustic wave resonators 14, a plurality of (two in the example in FIG. 1) capacitors C12 and C13, and a plurality of (three in the example in FIG. 1) inductors L11 to L13. The first acoustic wave filter device 100 has a pass band including a transmitting band of a first communication band. For example, the first communication band is Band 8 of the 3GPP LTE standard, but may be other bands than the Band 8.

The plurality of acoustic wave resonators 14 include five series arm resonators S1 to S5 and four parallel arm resonators P1 to P4. The five series arm resonators S1 to S5 are provided on a signal path (series arm path) 156. The signal path 156 is a portion of a path between the first signal terminal T1 and the second signal terminal T2. The five series arm resonators S1 to S5 are connected in series on the signal path 156. In the first acoustic wave filter device 100, on the signal path 156, the series arm resonator S1, the series arm resonator S2, the series arm resonator S3, the series arm resonator S4, and the series arm resonator S5 are aligned from the second signal terminal from the T2 side, in this order of the series arm resonator S1, the series arm resonator S2, the series arm resonator S3, the series arm resonator S4, and the series arm resonator S5. The parallel arm resonator P1 is provided on a path (parallel arm path) 157 between the path between the series arm resonator S1 and the series arm resonator S2 in the signal path 156 and the ground. The parallel arm resonator P2 is provided on a path (parallel arm path) 158 between the path between the series arm resonator S2 and the series arm resonator S3 in the signal path 156 and the ground. The parallel arm resonator P3 is provided on a path (parallel arm path) 159 between the path between the series arm resonator S3 and the series arm resonator S4 in the signal path 156 and the ground. The parallel arm resonator P4 is provided on a path (parallel arm path) 160 between the path between the series arm resonator S4 and the series arm resonator S5 in the signal path 156 and the ground.

The capacitor C12 is connected in parallel to the series arm resonator S2. The capacitor C13 is connected in parallel to the series arm resonator S3.

The inductor L11 is connected between the series arm resonator S1 and the second signal terminal T2. More specifically, one end of the inductor L11 is connected to the series arm resonator S1, and the other end of the inductor L11 is connected to the second signal terminal T2. The inductor L12 is connected between a connection point between the two parallel arm resonators P1 and P2 and the ground. More specifically, one end of the inductor L12 is connected to the connection point between the two parallel arm resonators P1 and P2, and the other end of the inductor L12 is connected to the ground (first ground terminal of the high frequency module 500). The inductor L13 is connected between a connection point between the two parallel arm resonators P3 and P4 and the ground. More specifically, one end of the inductor L13 is connected to the connection point between the two parallel arm resonators P3 and P4, and the other end of the inductor L13 is connected to the ground (second ground terminal of the high frequency module 500).

(2.2) Circuit Configuration of Second Acoustic Wave Filter Device

As shown in FIG. 1, the second acoustic wave filter device 200 is a ladder filter, and includes a plurality of (seven in the example in FIG. 1) acoustic wave resonators 24, a plurality of (three in the example in FIG. 1) capacitors C21 to C23, and an inductor L21. The second acoustic wave filter device 200 has a pass band including a receiving band of a second communication band. For example, the second communication band is the Band 8 of the 3GPP LTE standard, but may be other bands than the Band 8.

The plurality of acoustic wave resonators 24 include three series arm resonators S11 to S13, a longitudinally coupled resonator DMS1, and three parallel arm resonators P11 to P13. The three series arm resonators S11 to S13 and the longitudinally coupled resonator DMS1 are provided on the signal path (series arm path) 256. The signal path 256 is a portion of the path between the first signal terminal T1 and the third signal terminal T3. The three series arm resonators S11 to S13 and the longitudinally coupled resonator DMS1 are connected in series on the signal path 256. In the second acoustic wave filter device 200, on the signal path 256, the series arm resonator S11, the series arm resonator S12, the longitudinally coupled resonator DMS1, and the series arm resonator S13 are aligned from the first signal terminal T1 side, in this order of the series arm resonator S11, the series arm resonator S12, the longitudinally coupled resonator DMS1, and the series arm resonator S13. The parallel arm resonator P11 is provided on a path (parallel arm path) 257 between the path between the series arm resonator S11 and the series arm resonator S12 in the signal path 256 and the ground. The parallel arm resonator P12 is provided on a path (parallel arm path) 258 between the path between the series arm resonator S12 and the longitudinally coupled resonator DMS1 in the signal path 256 and the ground. The parallel arm resonator P13 is provided on a path (parallel arm path) 259 between a path between the series arm resonator S13 and the inductor L21 in the signal path 256 and the ground.

The capacitor C21 is connected in parallel to the series arm resonator S22. The capacitor C22 is connected in parallel to the parallel arm resonator P11. The capacitor C23 is connected in parallel to the parallel arm resonator P12.

The inductor L21 is connected between the series arm resonator 13 and the parallel arm resonator P13 and the third signal terminal T3. More specifically, one end of the inductor L21 is connected to the series arm resonator S13 and the parallel arm resonator P13, and the other end of the inductor L21 is connected to the third signal terminal T3.

(3) Structure of First Acoustic Wave Filter Device

The first acoustic wave filter device 100 includes the plurality of acoustic wave resonators 14 (refer to FIG. 1).

Figures 2A, 2B:
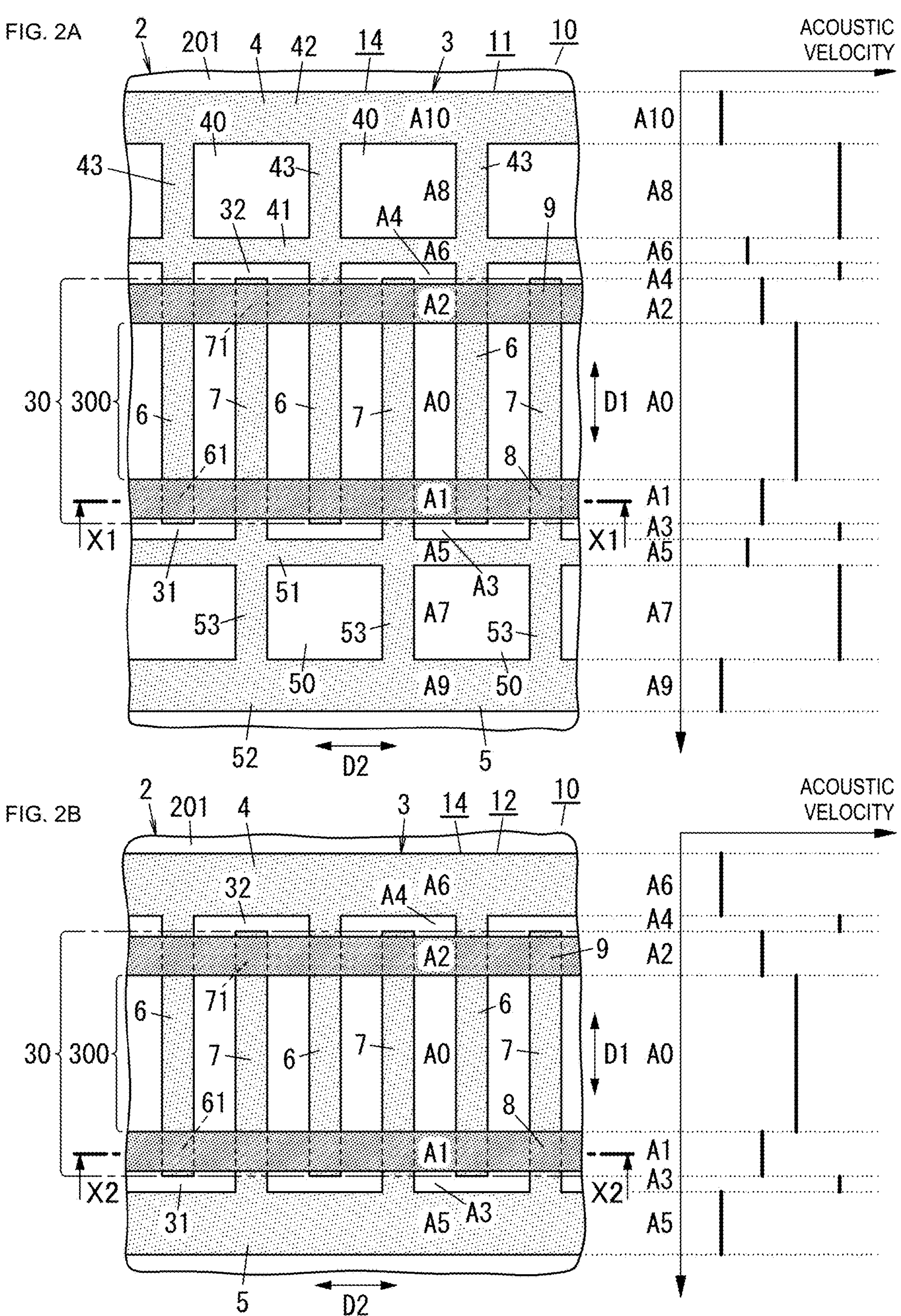
FIG. 2A is a schematic view for describing a velocity distribution in a predetermined direction, in an acoustic velocity of an acoustic wave propagating in an acoustic wave propagation direction in a first acoustic wave resonator of an acoustic wave filter device according to an example embodiment of the present invention.
FIG. 2B is a schematic view for describing a velocity distribution in a predetermined direction, in an acoustic velocity of an acoustic wave propagating in the acoustic wave propagation direction in a second acoustic wave resonator of an acoustic wave device according to an example embodiment of the present invention.

Each of the plurality of acoustic wave resonators 14 is a surface acoustic wave (SAW) resonator. Each of the plurality of acoustic wave resonators 14 includes a piezoelectric substrate 2 and an interdigital transducer (IDT) electrode 3, as shown in FIGS. 2A, 2B, 3A, and 3B. The IDT electrode 3 is provided on the piezoelectric substrate 2. Description of "provided on the piezoelectric substrate 2" includes a case of being directly provided on the piezoelectric substrate 2 and a case of being indirectly provided on the piezoelectric substrate 2. The acoustic wave filter device 100 includes two reflectors disposed to be adjacent to the IDT electrode 3 with respect to each of the plurality of IDT electrodes 3. For example, each of the reflectors is a short-circuit grating. In FIGS. 2A and 2B, dot hatching is assigned to the IDT electrode 3. However, the hatching does not represent a section, and is assigned only to facilitate understanding of a relationship between the IDT electrode 3 and the piezoelectric substrate 2.

(3.1) Piezoelectric Substrate

Figures 3A, 3B:
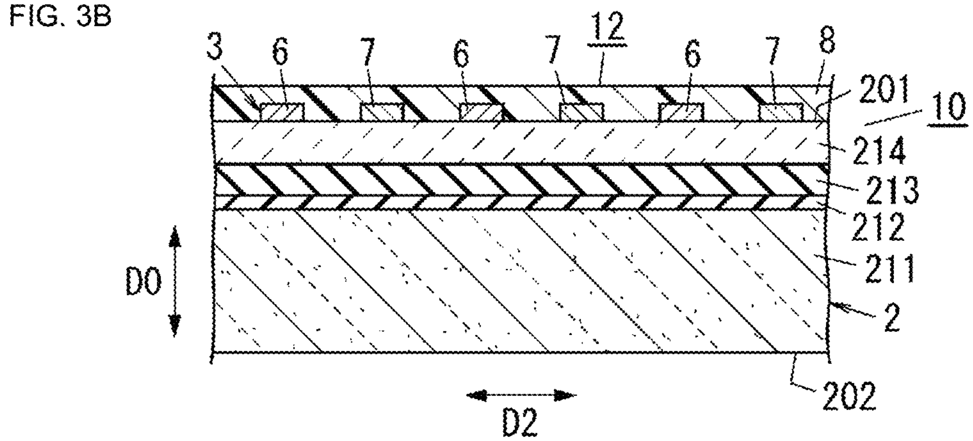
FIG. 3A relates to the first acoustic wave resonator of an acoustic wave filter device according to an example embodiment of the present invention, and is a sectional view taken along line X1-X1 in FIG. 2A.
FIG. 3B relates to the second acoustic wave resonator of an acoustic wave filter device according to an example embodiment of the present invention, and is a sectional view taken along line X2-X2 in FIG. 2B.

As shown in FIGS. 3A and 3B, the piezoelectric substrate 2 includes a first main surface 201 and a second main surface 202 which face each other in a thickness direction DO of the piezoelectric substrate 2. Here, description of "facing" means facing geometrically rather than facing physically. An outer edge of the piezoelectric substrate 2 has a rectangular shape, for example, in a plan view in the thickness direction DO of the piezoelectric substrate 2.

The piezoelectric substrate 2 has piezoelectricity. In the first acoustic wave filter device 100 according to Example Embodiment 1, the piezoelectric substrate 2 includes a support substrate 211, a high acoustic velocity film 212, a low acoustic velocity film 213, and a piezoelectric body layer 214. In the piezoelectric substrate 2, the piezoelectric body layer 214 has the piezoelectricity. The high acoustic velocity film 212 is provided on the support substrate 211. The low acoustic velocity film 213 is provided on the high acoustic velocity film 212. The piezoelectric body layer 214 is provided on the low acoustic velocity film 213. The high acoustic velocity film 212 is a film in which an acoustic velocity of a bulk wave propagating through the high acoustic velocity film 212 is higher than an acoustic velocity of a bulk wave propagating through the piezoelectric body layer 214. The low acoustic velocity film 213 is a film in which an acoustic velocity of a bulk wave propagating through the low acoustic velocity film 213 is lower than an acoustic velocity of a bulk wave propagating through the piezoelectric body layer 214.

For example, the piezoelectric body layer 214 is a 35° Y-cut X-propagation lithium tantalate single crystal. When a wavelength of an acoustic wave determined by an electrode finger pitch of the IDT electrode 3 is defined as A, it is preferable that a thickness of the piezoelectric body layer 214 is about 3.5λ or smaller, for example, from a viewpoint of improving a Q value of the acoustic wave resonator 14. In this case, in the support substrate 211, the acoustic velocity of the bulk wave propagating through the support substrate 211 is higher than the acoustic velocity of the acoustic wave the propagating through piezoelectric body layer 214. Here, the bulk wave propagating through the support substrate 211 is the bulk wave having a lowest acoustic velocity in a plurality of bulk waves propagating through the support substrate 211. For example, the thickness of the piezoelectric body layer 214 is about 900 nm, but is not limited to about 900 nm. When the piezoelectric body layer 214 is a Y-cut X-propagation lithium tantalate crystal, the acoustic wave resonator 14 can use a mode having an SH wave as a main component as a main mode by using the SH wave as the acoustic wave. For example, a wavelength of the acoustic wave is about 5.3 μm. A cut-angle is not limited to about 35°. A material of the piezoelectric body layer 214 is not limited to the lithium tantalate, and may be lithium niobate, for example. In addition, the piezoelectric body layer 214 is not limited to a piezoelectric single crystal, but may be piezoelectric ceramics.

For example, the support substrate 211 is a silicon substrate. For example, it is preferable that the thickness of the silicon substrate is about 10λ or larger and about 180 μm or smaller. For example, a surface orientation of the main surface of the silicon substrate is (111) surface. Without being limited thereto, the surface orientation may be (110) surface or (111) surface. For example, resistivity of the silicon substrate is about 1 kΩcm or higher, is preferably about 2 kΩcm or higher, and is more preferably about 4 kΩcm or higher. For example, the thickness of the support substrate 211 is about 120 μm. As a material of the support substrate 211, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, forsterite, a dielectric such as diamond and glass, a semiconductor such as silicon, gallium nitride, or a resin, and alternatively, a material having the above-described materials as the main component can be used.

For example, the high acoustic velocity film 212 is a silicon nitride film. With regard to the thickness of the high acoustic velocity film 212, the high acoustic velocity film 212 has a function of confining the acoustic wave into the piezoelectric body layer 214 and the low acoustic velocity film 213. Therefore, it is desirable that the thickness of the high acoustic velocity film 212 is as large as possible. For example, the thickness of the high acoustic velocity film 212 is preferably about 0.5λ or larger, and is more preferably about 1.5λ or larger. For example, the thickness of the high acoustic velocity film 212 is about 300 nm, but is not limited to about 300 nm. A material of the high acoustic velocity film 212 is not limited to silicon nitride. As a material of the high acoustic velocity film 212, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, forsterite, spinel, and sialon, a dielectric such as aluminum oxide, silicon oxynitride, diamond-like carbon (DLC), and diamond, or a semiconductor such as silicon, and alternatively, a material having the above-described materials as the main component can also be used. The above-described spinel includes an aluminum compound containing one or more elements selected from Mg, Fe, Zn, and Mn, and oxygen. Examples of the above-described spinel can include $MgAl_2O_4$, $FeAl_2O_4$, $ZnAl_2O_4$, and $MnAl_2O_4$.

For example, the low acoustic velocity film 213 is a silicon oxide film. The thickness of the low acoustic velocity film 213 is preferably about 3.5λ or smaller from a viewpoint of improving a Q value of the acoustic wave resonator 14, and is more preferably about 2.0λ or smaller from a viewpoint of reducing an absolute value of a temperature coefficient of frequency. For example, the thickness of the low acoustic velocity film 213 is about 673 nm, but is not limited to about 673 nm. The material of the low acoustic velocity film 213 is not limited to silicon oxide. As the material of the low acoustic velocity film 213, for example, a dielectric such as a compound obtained by adding fluorine, carbon, or boron to glass, silicon oxynitride, lithium oxide, tantalum oxide, and silicon oxide, or a material having the above-described materials as the main component can also be used.

(3.2) IDT Electrode

The IDT electrode 3 has conductivity. As a material of the IDT electrode 3, for example, aluminum, copper, platinum, gold, silver, titanium, nickel, chromium, molybdenum, tungsten, tantalum, magnesium, iron, or an alloy mainly based on any one of these metallic materials may be used. In addition, the IDT electrode 3 may have a structure in which a plurality of metal films formed of these metallic materials or the alloy are laminated.

As shown in FIGS. 2A and 2B, the IDT electrode 3 includes a first busbar 4, a second busbar 5, a plurality of first electrode fingers 6, and a plurality of second electrode fingers 7.

In the IDT electrode 3, the first busbar 4 and the second busbar 5 face each other in a first direction D1 (hereinafter, also referred to as a predetermined direction D1) orthogonal to the thickness direction DO of the piezoelectric substrate 2. That is, the second busbar 5 faces the first busbar 4 in the predetermined direction D1.

The first busbar 4 and the second busbar 5 have an elongated shape in which a second direction D2 orthogonal to the predetermined direction D1 is set as a longitudinal direction. The second direction D2 is also orthogonal to the thickness direction DO of the piezoelectric substrate 2.

The plurality of first electrode fingers 6 are connected to the first busbar 4, and extend from the first busbar 4 to the second busbar 5 side in the predetermined direction D1. More specifically, the plurality of first electrode fingers 6 extend from the first busbar 4 along a direction orthogonal to the longitudinal direction of the first busbar 4. In examples in FIGS. 2A and 2B, the plurality of first electrode fingers 6 have lengths the same as each other. In the IDT electrode 3, the plurality of first electrode fingers 6 and the second busbar 5 are separated, and a gap 31 is provided between the first electrode finger 6 and the second busbar 5 which face each other in the predetermined direction D1. When the wavelength of the acoustic wave of the above-described main mode is defined as A, in the acoustic wave resonator 14 of the present example embodiment, the length of the gap 31 in the predetermined direction D1 is shorter than about 0.3λ, for example.

The plurality of second electrode fingers 7 are connected to the second busbar 5, and extend from the second busbar 5 to the first busbar 4 side in the first direction D1. More specifically, the plurality of second electrode fingers 7 extend from the second busbar 5 along a direction orthogonal to the longitudinal direction of the second busbar 5. In examples in FIGS. 2A and 2B, the plurality of second electrode fingers 7 have lengths the same as each other. In the IDT electrode 3, the plurality of second electrode fingers 7 and the first busbar 4 are separated, and a gap 32 is provided between the second electrode finger 7 and the first busbar 4 which face each other in the predetermined direction D1. In the acoustic wave resonator 14 of the present example embodiment, the length of the gap 32 in the predetermined direction D1 is shorter than about 0.3λ, for example.

In the IDT electrode 3, the plurality of first electrode fingers 6 and the plurality of second electrode fingers 7 are alternately aligned one by one and separated from each other in the second direction D2. Therefore, the first electrode finger 6 and the second electrode finger 7 which are adjacent to each other in the second direction D2 are separated from each other. In the IDT electrode 3, the number of pairs of the first electrode finger 6 and the second electrode finger 7 is 88 pairs as an example. That is, as an example, the IDT electrode 3 includes 88 first electrode fingers 6 and 88 second electrode fingers 7. The IDT electrode 3 excites the acoustic wave in an intersecting region 30 (refer to FIGS. 4 and 5). The intersecting region 30 is a region between an envelope 36 of tip edges of the plurality of first electrode fingers 6 and an envelope 37 of tip edges of the plurality of second electrode fingers 7. A propagation direction of the acoustic wave is a direction along the second direction D2.

For example, characteristics of the acoustic wave resonator 14 can be changed by appropriately changing an electrode finger pitch of the IDT electrode 3, a width W30 (hereinafter, also referred to as an intersecting width W30) of the intersecting region 30 of the IDT electrode 3 in the predetermined direction D1, and a material of the piezoelectric substrate 2. For example, the intersecting width W30 is about 12λ.

Figure 5:
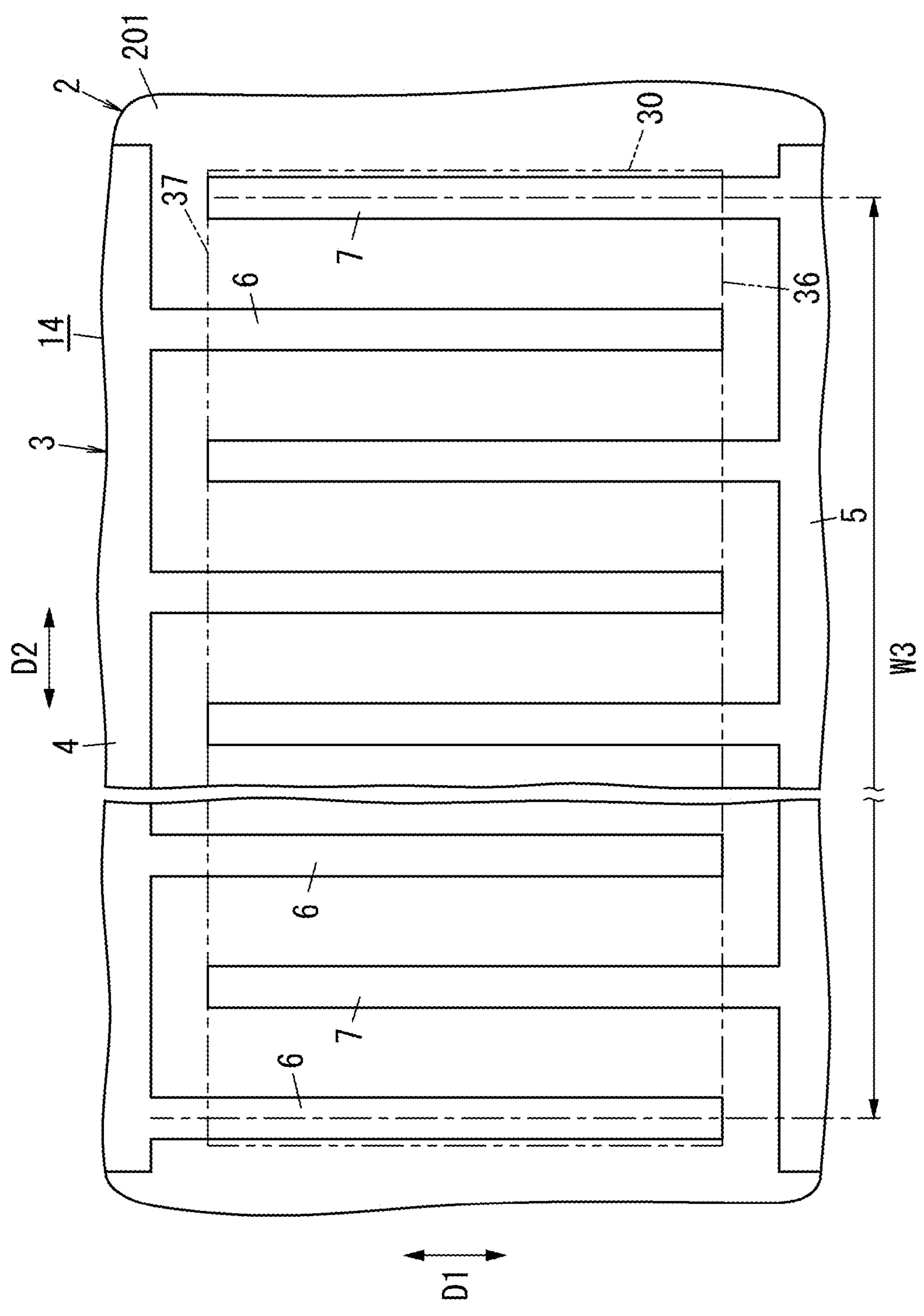
FIG. 5 is a plan view of a main part for describing an electrode finger pitch of an IDT electrode in an acoustic wave device of an acoustic wave filter device according to an example embodiment of the present invention.

The electrode finger pitch of the IDT electrode 3 is an average electrode finger pitch, and as shown in FIG. 5, the electrode finger pitch is a value obtained by calculation of (W3/N)×2, when a distance between a center line of the first electrode finger 6 in one end and a center line of the second electrode finger 7 in the other end in the second direction D2 is defined as W3, and the number of gaps between adjacent electrode fingers in the second direction D2 is defined as N. In this manner, the electrode finger pitch of the IDT electrode 3 is set to an average value of the distances between the center lines of the two adjacent first electrode fingers 6 in the plurality of first electrode fingers 6 or an average value of the distances between the center lines of the two adjacent second electrode fingers 7 in the plurality of second electrode fingers 7.

In the first acoustic wave filter device 100 according to Example Embodiment 1, each of the plurality of acoustic wave resonators 14 includes a first mass addition film 8 and a second mass addition film 9.

The first mass addition film 8 overlaps a tip end portion 61 of each of the plurality of first electrode fingers 6. The tip end portion 61 of each of the plurality of first electrode fingers 6 is a portion including a tip edge of the first electrode finger 6. The first mass addition film 8 has an elongated shape in which the second direction D2 is set as the longitudinal direction in a plan view in the thickness direction DO of the piezoelectric substrate 2. The first mass addition film 8 covers a portion of the first main surface 201 of the piezoelectric substrate 2, a portion of the tip end portion 61 of each of the plurality of first electrode fingers 6, and a portion of each of the plurality of second electrode fingers 7. The first mass addition film 8 does not overlap the tip edges of the plurality of first electrode fingers 6 in a plan view in the thickness direction DO of the piezoelectric substrate 2, and is located on the first busbar 4 side with respect to the tip edges of the plurality of first electrode fingers 6. However, the first mass addition film 8 may cover all of the tip end portions 61 including the tip edges of the plurality of first electrode fingers 6. The first mass addition film 8 is a dielectric film. For example, a material of the first mass addition film 8 includes tantalum pentoxide. For example, the thickness of the first mass addition film 8 is about 35 nm.

The second mass addition film 9 overlaps the tip end portion 71 of each of the plurality of second electrode fingers 7. The tip end portion 71 of each of the plurality of second electrode fingers 7 is a portion including the tip edge of the second electrode finger 7. The second mass addition film 9 has an elongated shape in which the second direction D2 is set as the longitudinal direction in a plan view in the thickness direction DO of the piezoelectric substrate 2. The second mass addition film 9 covers a portion of the first main surface 201 of the piezoelectric substrate 2, a portion of the tip end portion 71 of each of the plurality of second electrode fingers 7, and a portion of each of the plurality of second electrode fingers 7. The second mass addition film 9 does not overlap the tip edges of the plurality of second electrode fingers 7 in a plan view in the thickness direction DO of the piezoelectric substrate 2, and is located on the second busbar 5 side with respect to the tip edges of the plurality of second electrode fingers 7. However, the second mass addition film 9 may cover all of the tip end portions 71 including the tip edges of the plurality of second electrode fingers 7. The second mass addition film 9 is a dielectric film. For example, a material of the second mass addition film 9 includes tantalum pentoxide. For example, the thickness of the second mass addition film 9 is about 35 nm.

Figure 4:
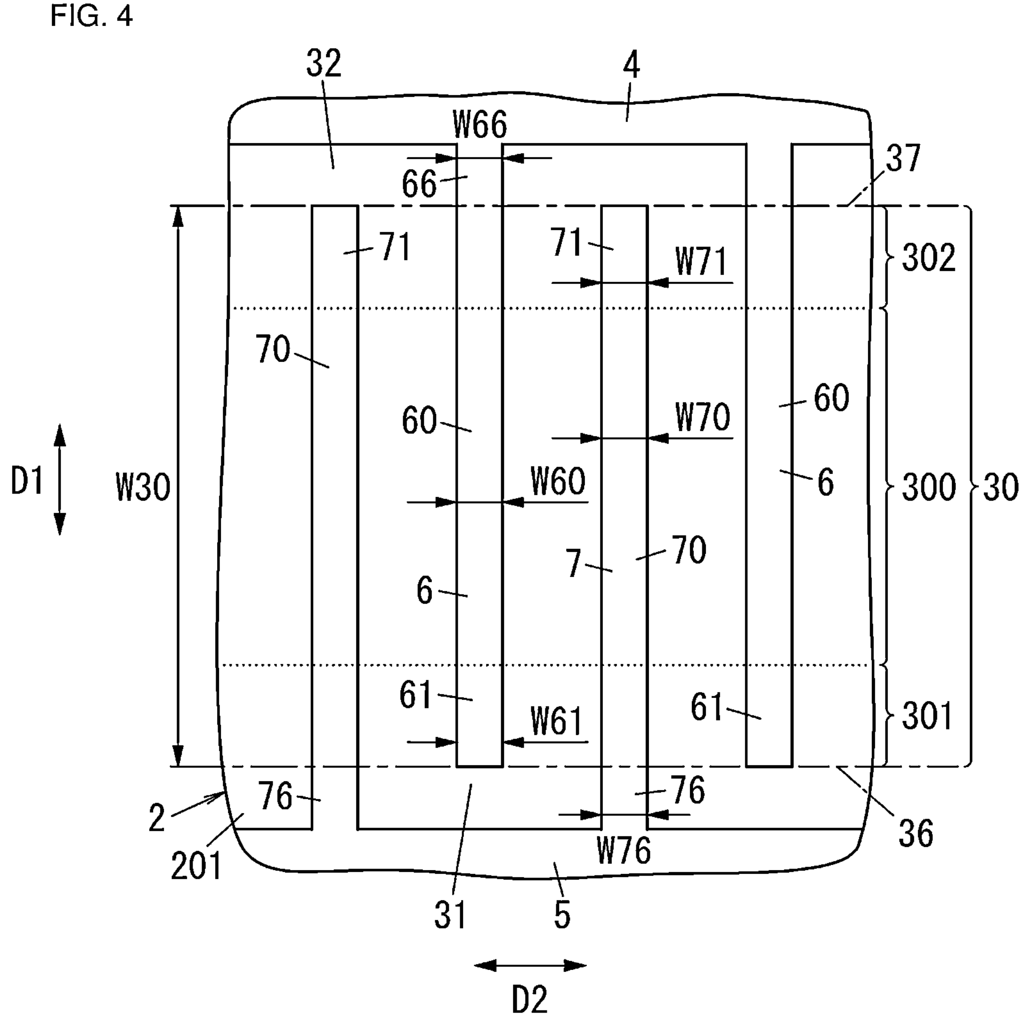
FIG. 4 relates to an acoustic wave resonator of an acoustic wave filter device according to an example embodiment of the present invention, and is a partially broken plan view for describing a width of an intersecting region of an IDT electrode, a width of a central portion of a first electrode finger, and a width of a central portion of a second electrode finger.

As shown in FIG. 4, a central portion 300 of the intersecting region 30 in the predetermined direction D1 is a portion between a first end portion 301 including the tip end portions 61 of the plurality of first electrode fingers 6 and a second end portion 302 including the tip end portions 71 of the plurality of second electrode fingers 7. In the present example embodiment, the first end portion 301 of the intersecting region 30 is in a range the same as that of the first mass addition film 8 in a plan view in the thickness direction DO of the piezoelectric substrate 2. In the present example embodiment, the second end portion 302 of the intersecting region 30 is in a range the same as that of the second mass addition film 9 in a plan view in the thickness direction DO of the piezoelectric substrate 2.

Each of the plurality of first electrode fingers 6 includes a base end portion 66, a central portion 60, and a tip end portion 61. In the present example embodiment, the tip end portion 61 of each of the plurality of first electrode fingers 6 is an overlapping portion of the first mass addition film 8. For example, the width of the e first mass addition film 8 in the predetermined direction D1 is about 0.8λ. In each of the plurality of first electrode fingers 6, the base end portion 66, the central portion 60, and the tip end portion 61 are aligned from the first busbar 4 side in the predetermined direction D1 in this order of the base end portion 66, the central portion 60, and the tip end portion 61. In the present example embodiment, the central portion 60 of each of the plurality of first electrode fingers 6 is a portion existing in the central portion 300 of the intersecting region 30 in the predetermined direction D1. The base end portion 66 of each of the plurality of first electrode fingers 6 is a portion between the central portion 60 and the first busbar 4 in the predetermined direction D1.

The plurality of first electrode fingers 6 have mutually the same width W66 of the base end portion 66. In addition, the plurality of first electrode fingers 6 have mutually the same width W60 of the central portion 60. In addition, the plurality of first electrode fingers 6 have mutually the same width W61 of the tip end portion 61. In the present example embodiment, the width W66, the width W60, and the width W61 are the same.

Each of the plurality of second electrode fingers 7 includes a base end portion 76, a central portion 70, and a tip end portion 71. In the present example embodiment, the tip end portion 71 of each of the plurality of second electrode fingers 7 is an overlapping portion of the second mass addition film 9. For example, the width of the second mass addition film 9 in the predetermined direction D1 is about 0.8λ. In each of the plurality of second electrode fingers 7, the base end portion 76, the central portion 70, and the tip end portion 71 are aligned from the second busbar 5 side in the predetermined direction D1 in this order of the base end portion 76, the central portion 70, and the tip end portion 71. In the present example embodiment, the central portion 70 of each of the plurality of second electrode fingers 7 is a portion existing in the central portion 300 of the intersecting region 30 in the predetermined direction D1. The base end portion 76 of each of the plurality of second electrode fingers 7 is a portion between the central portion 70 and the second busbar 5 in the predetermined direction D1.

The plurality of second electrode fingers 7 have mutually the same width W76 of the base end portion 76. In addition, the plurality of second electrode fingers 7 have mutually the same width W70 of the central portion 70. In addition, the plurality of second electrode fingers 7 have mutually the same width W71 of the tip end portion 71. In the present example embodiment, the width W76, the width W70, and the width W71 are the same.

The plurality of acoustic wave resonators 14 include a first acoustic wave resonator 11 and a second acoustic wave resonator 12. Hereinafter, the first acoustic wave resonator 11 will be described with reference to FIG. 2A, and the second acoustic wave resonator 12 will be described with reference to FIG. 2B.

As shown in FIG. 2A, in the first acoustic wave resonator 11, the first busbar 4 includes an inner busbar portion 41, an outer busbar portion 42, a plurality of gaps 40 between the inner busbar portion 41 and the outer busbar portion 42, and a plurality of connecting portions 43. For example, the plurality of gaps 40 are aligned at an equal interval in the second direction D2. The inner busbar portion 41 is located on the intersecting region 30 side with respect to the plurality of gaps 40 in the predetermined direction D1. The outer busbar portion 42 is located on a side opposite to the inner busbar portion 41 when viewed from the plurality of gaps 40 in the predetermined direction D1. The plurality of connecting portions 43 connect the inner busbar portion 41 and the outer busbar portion 42 in the predetermined direction D1. For example, the plurality of connecting portions 43 are aligned at an equal interval in the second direction D2. One gap 40 in the plurality of gaps 40 is located between two connecting portions 43 adjacent to each other in the second direction D2 in the plurality of connecting portions 43. In short, in the first busbar 4, the plurality of connecting portions 43 and the plurality of gaps 40 are alternately aligned one by one in the second direction D2. In the example in FIG. 2A, the plurality of connecting portions 43 correspond to the plurality of first electrode fingers 6 on a one-to-one basis, and are aligned with the corresponding first electrode fingers 6 in the predetermined direction D1. However, example embodiments of the present invention are not limited thereto. That is, the number of the connecting portions 43 and positions of the plurality of connecting portions 43 are not limited to the example in FIG. 2A.

In addition, an opening shape of each of the plurality of gaps 40 is a rectangular shape, but example embodiments of the present invention are not limited thereto. When the wavelength of the above-described acoustic wave is set to A, the width of the inner busbar portion 41 in the predetermined direction D1 is about 0.5λ or smaller, for example. The length of the gap 40 in the predetermined direction D1 is about 0.3λ or longer, and is about 1.0λ as an example.

In addition, in the first acoustic wave resonator 11, the second busbar 5 includes an inner busbar portion 51, an outer busbar portion 52, a plurality of gaps 50 between the inner busbar portion 51 and the outer busbar portion 52, and a plurality of connecting portions 53. For example, the plurality of gaps 50 are aligned at an equal interval in the second direction D2. The inner busbar portion 51 is located on the intersecting region 30 side with respect to the plurality of gaps 50 in the predetermined direction D1. The outer busbar portion 52 is located on a side opposite to the inner busbar portion 51 when viewed from the plurality of gaps 50 in the predetermined direction D1. The plurality of connecting portions 53 connect the inner busbar portion 51 and the outer busbar portion 52 in the predetermined direction D1. For example, the plurality of connecting portions 53 are aligned at an equal interval in the second direction D2. One gap 50 in the plurality of gaps 50 is located between two connecting portions 53 adjacent to each other in the second direction D2 in the plurality of connecting portions 53. In short, in the second busbar 5, the plurality of connecting portions 53 and the plurality of gaps 50 are alternately aligned one by one in the second direction D2. In the example in FIG. 2A, the plurality of connecting portions 53 correspond to the plurality of second electrode fingers 7 on a one-to-one basis, and are aligned with the corresponding second electrode fingers 7 in the predetermined direction D1. However, example embodiments of the present invention are not limited thereto. That is, the number of the connecting portions 53 and positions of the plurality of connecting portions 53 are not limited to the example in FIG. 2A.

In addition, an opening shape of each of the plurality of gaps 50 is a rectangular shape, but example embodiments of the present invention are not limited thereto. The width of the inner busbar portion 51 in the predetermined direction D1 is about 0.5λ or smaller, for example. The length of the gap 50 in the predetermined direction D1 is about 0.3λ or longer, and is about 1.0λ as an example.

The first acoustic wave resonator 11 in the acoustic wave filter device 100 according to Example Embodiment 1 has a structure that reduces or prevents transverse mode ripple by forming a piston mode in the IDT electrode 3. This point will be described with reference to FIG. 2A.

The first acoustic wave resonator 11 includes a plurality of (11) regions A0 to A10 aligned in the predetermined direction D1, as shown on a left side in FIG. 2A, in a plan view in the thickness direction DO of the piezoelectric substrate 2. The 11 regions A0 to A10 include mutually different portions in each of the piezoelectric substrate 2 and the IDT electrode 3. The 11 regions A0 to A10 are strip-shaped regions which are long in the second direction D2 in a plan view in the thickness direction DO of the piezoelectric substrate 2. A right side in FIG. 2A schematically shows a velocity (acoustic velocity) of the acoustic wave propagating through the 11 regions A0 to A10.

The acoustic velocity in each of the regions A0 to A10 is obtained in such a manner that a simulation using a finite element method is performed by using parameters (material, Euler and thickness) of the piezoelectric substrate 2 and parameters (material, thickness, and electrode finger pitch) of the IDT electrode 3.

In the first acoustic wave resonator 11, the region A0 of the 11 regions A0 to A11 defines a central region including the central portion 300 of the intersecting region 30 of the IDT electrode 3 in the predetermined direction D1. The region A0 includes a first central portion 60 of the plurality of first electrode fingers 6 and a second central portion 70 of the plurality of second electrode fingers 7. The central region (region A0) is a region where the central portion 60 of the plurality of first electrode fingers 6 and the central portion 70 of the plurality of second electrode fingers 7 overlap each other in the second direction D2. In the region A0, a value (duty ratio) obtained in such a manner that an electrode finger width (width 60 of the central portion W60 of the first electrode finger 6 or width W70 of the central portion 70 of the second electrode finger) is divided by a half value of the electrode finger pitch is about 0.6, for example.

The region A1 includes a portion of the tip end portion 61 of each of the plurality of first electrode fingers 6 and the base end portion 76 of each of the plurality of second electrode fingers 7. In the present example embodiment, the region A1 includes the first mass addition film 8. The region A2 includes a portion of the tip end portion 71 of each of the plurality of second electrode fingers 7 and a portion of the base end portion 66 of each of the plurality of first electrode fingers 6. In the present example embodiment, the region A2 includes the second mass addition film 9. The region A3 includes the plurality of gaps 31. The region A4 includes the plurality of gaps 32. The region A5 includes the inner busbar portion 51 of the second busbar 5. The region A6 includes the inner busbar portion 41 of the first busbar 4. The region A7 includes the plurality of gaps 50 and the plurality of connecting portions 53. The region A8 includes the plurality of gaps 40 and the plurality of connecting portions 43. The region A9 includes the outer busbar portion 52 of the second busbar 5. The region A10 includes the outer busbar portion 42 of the first busbar 4. In the present example embodiment, the region A1 forms a first region including the tip end portions 61 of the plurality of first electrode fingers 6. In addition, in the present example embodiment, the region A2 forms a second region including the tip end portions 71 of the plurality of second electrode fingers 7. In addition, in the present example embodiment, the region A7 forms a third region having the gap 50 having the length of about 0.3λ or longer in the predetermined direction D1 outside of the first region in the predetermined direction D1. In addition, in the present example embodiment, the region A8 forms a fourth region having the gap 40 having the length of about 0.3λ or longer in the predetermined direction D1 outside of the second region in the predetermined direction D1. In the present example embodiment, the first acoustic wave resonator 11 has the central region, the first region, the second region, the third region, and the fourth region. In this manner, a piston mode can be generated.

In each of the region A1 and the region A2, the acoustic velocity of the acoustic wave is lower than that of the region A0. In the region A3 and the region A4, the acoustic velocity of the acoustic wave is higher than that of the region A0. In the region A5 and the region A6, the acoustic velocity of the acoustic wave is lower than that of the region A0. In the region A7 and the region A8, the acoustic velocity of the acoustic wave is higher than that of the region A0. In the region A9 and the region A10, the acoustic velocity of the acoustic wave is lower than that of the region A0.

As shown in FIG. 2B, the second acoustic wave resonator 12 includes regions A0 to A6, as in the first acoustic wave resonator 11. However, the second acoustic wave resonator 12 does not include the region A7 and the region A8. That is, the second acoustic wave resonator 12 does not include the third region and the fourth region. In addition, the second acoustic wave resonator 12 does not include the region A9 and the region A10.

In the present example embodiment, the piezoelectric substrate 2 of the plurality of acoustic wave resonators 14 is used in common in the first acoustic wave filter device 100. Therefore, the piezoelectric substrate 2 of the first acoustic wave resonator 11 and the piezoelectric substrate 2 of the second acoustic wave resonator 12 are the same. The first acoustic wave filter device 100 includes a one-chip acoustic wave device 10 including the plurality of acoustic wave resonators 14. The acoustic wave device 10 includes a plurality of external connection electrodes. As shown in FIG. 1, the plurality of external connection electrodes include a first input-output electrode 15 connected to the second signal terminal T2, a second input-output electrode 16 connected to the first signal terminal T1, a first ground electrode 17, and a second ground electrode 18.

In the present example embodiment, as shown in FIG. 1, nine acoustic wave resonators 14 include eight first acoustic wave resonators 11 and one second acoustic wave resonator 12. The eight first acoustic wave resonators 11 include the series arm resonator S4 having the largest electrode finger pitch in the five series arm resonators S1 to S5 provided in the signal path 156, and the parallel arm resonator P2 having the smallest electrode finger pitch in the four parallel arm resonators P1 to P4 connected between the signal path 156 and the ground. At least a portion of the frequency band between the resonant frequency and the anti-resonant frequency of the first acoustic wave resonator 11 is included in the pass band of the acoustic wave filter device 100.

In the present example embodiment, as shown in FIG. 1, the series arm resonator S1 is the second acoustic wave resonator 12. As long as each of the series arm resonator S4 and the parallel arm resonator P2 is the first acoustic wave resonator 11, the plurality of acoustic wave resonators 14 are not limited to the series arm resonator S1. At least one of the series arm resonators S2, S3, and S5 and the parallel arm resonators P1, P3, and P4 may be the second acoustic wave resonator 12.

(3.3) Reflector

Each reflector reflects the acoustic wave from the adjacent IDT electrode 3 side. Each reflector has conductivity. For example, a material of each reflector is aluminum, copper, platinum, gold, silver, titanium, nickel, chromium, molybdenum, tungsten, tantalum, magnesium, and iron, or an alloy mainly based on any one of these metallic materials. In addition, each reflector may have a structure in which a plurality of metal films formed of these metallic materials or the alloy are laminated. For example, the thickness of each reflector is about 300 nm.

(4) Structure of Second Acoustic Wave Filter Device

Figures 6A, 6B:
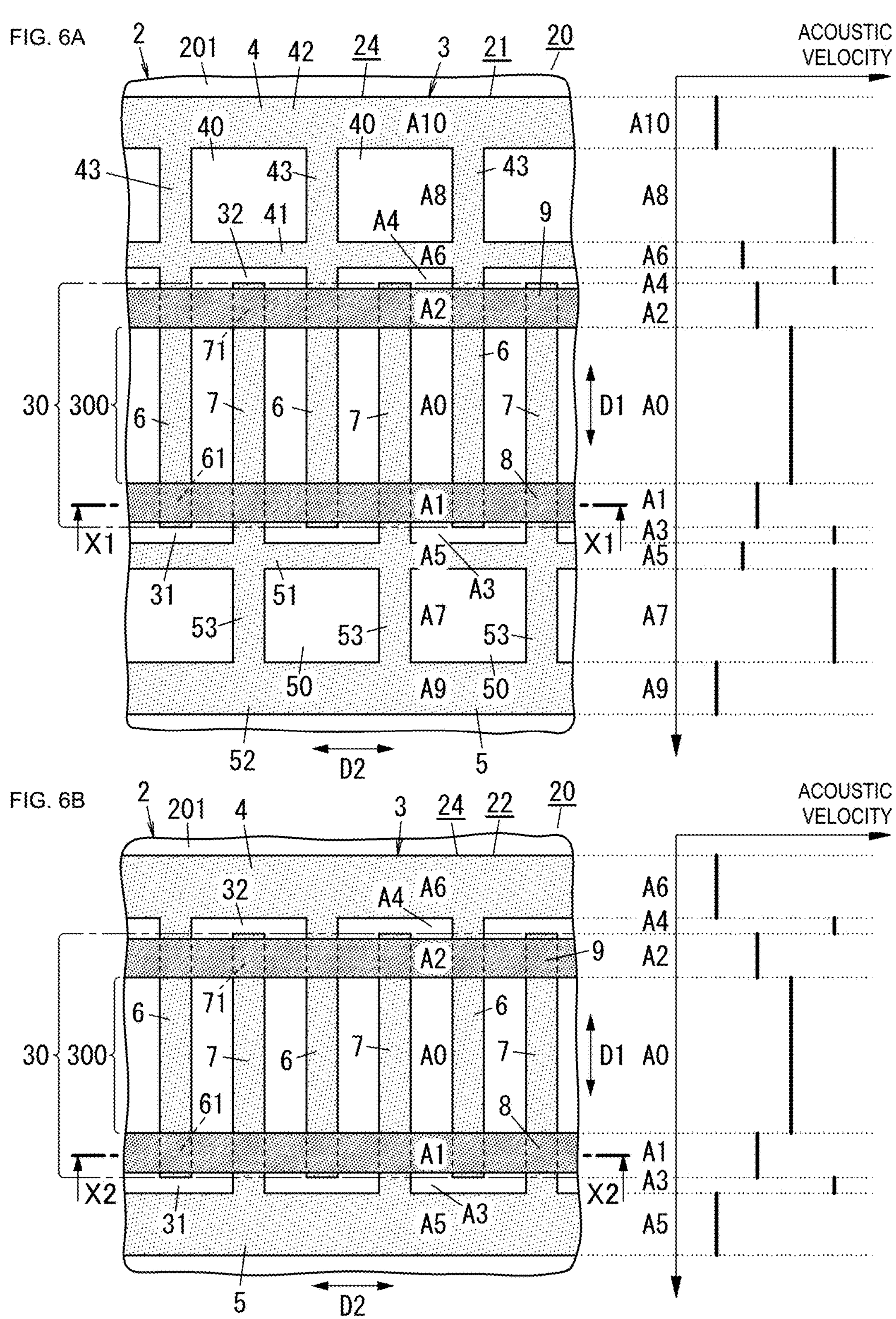
FIG. 6A is a schematic view for describing a velocity distribution in a predetermined direction, in an acoustic velocity of an acoustic wave propagating in the acoustic wave propagation direction in the first acoustic wave resonator of a second acoustic wave filter device different from a first acoustic wave filter device which is an acoustic wave filter device according to an example embodiment of the present invention.
FIG. 6B is a schematic view for describing a velocity distribution in a predetermined direction, in an acoustic velocity of an acoustic wave propagating in the acoustic wave propagation direction in the second acoustic wave resonator of a second acoustic wave filter device according to an example embodiment of the present invention.
Figures 7A, 7B:
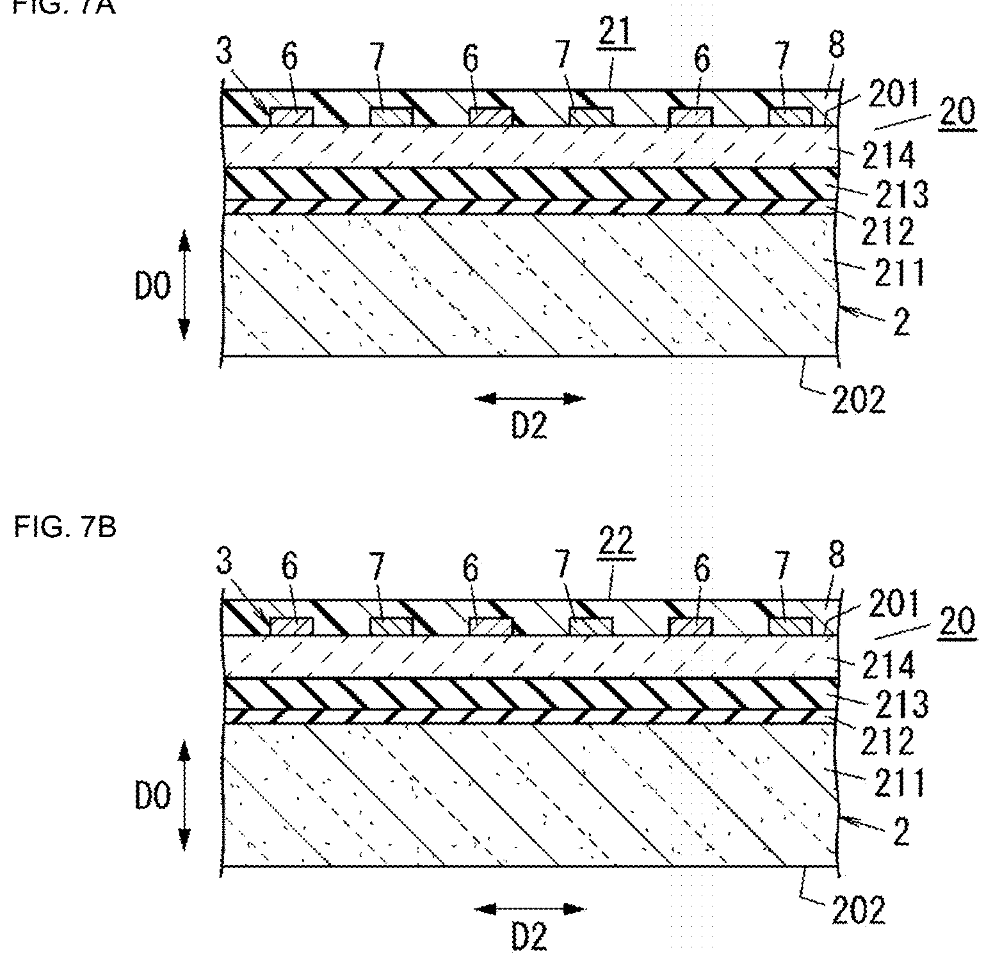
FIG. 7A relates to the first acoustic wave resonator of an second acoustic wave filter device according to an example embodiment of the present invention, and is a sectional view taken along line X1-X1 in FIG. 6A.
FIG. 7B relates to the second acoustic wave resonator of an second acoustic wave filter device according to an example embodiment of the present invention, and is a sectional view taken along line X2-X2 in FIG. 6B.

The second acoustic wave filter device 200 includes the plurality of acoustic wave resonators 24 (refer to FIG. 1). Each of the plurality of acoustic wave resonators 24 is a SAW resonator. Each of the plurality of acoustic wave resonators 24 includes the piezoelectric substrate 2 and the IDT electrode 3, as shown in FIGS. 6A, 6B, 7A, and 7B. The second acoustic wave filter device 200 includes two reflectors disposed to be adjacent to the IDT electrode 3 with respect to each of the plurality of IDT electrodes 3. With regard to the plurality of acoustic wave resonators 24, the same reference numerals are assigned to components the same as those of the plurality of acoustic wave resonators 14 of the first acoustic wave filter device 100, and description thereof is omitted. In FIGS. 6A and 6B, dot hatching is assigned to the IDT electrode 3. However, the hatching does not represent a section, and is assigned only to facilitate understanding of a relationship between the IDT electrode 3 and the piezoelectric substrate 2.

The plurality of acoustic wave resonators 24 include a first acoustic wave resonator 21 and a second acoustic wave resonator 22. With regard to the first acoustic wave resonator 21, the same reference numerals are assigned to components the same as those of the first acoustic wave resonator 11 of the first acoustic wave filter device 100, and description thereof is omitted.

The first acoustic wave resonator 21 includes the regions A0 to A10. The second acoustic wave resonator 22 includes the regions A0 to A6, and does not include the regions A7 to A10.

In the present example embodiment, as shown in FIG. 1, nine acoustic wave resonators 24 include five first acoustic wave resonators 21, one second acoustic wave resonator 12, and one longitudinally coupled resonator DMS1. The five first acoustic wave resonators 21 include the series arm resonator S12 having the largest electrode finger pitch in the three series arm resonators S11 to S13 provided in the signal path 256, and the parallel arm resonator P12 having the smallest electrode finger pitch in the three parallel arm resonators P11 to P13 connected between the signal path 256 and the ground.

In the present example embodiment, as shown in FIG. 1, the series arm resonator S13 is the second acoustic wave resonator 22. As long as each of the series arm resonator S12 and the parallel arm resonator P12 is the first acoustic wave resonator 21, the plurality of acoustic wave resonators 24 are not limited to the series arm resonator S13, and at least one of the series arm resonator S11 and the parallel arm resonators P11 and P13 may be the second acoustic wave resonator 22.

Figure 8:
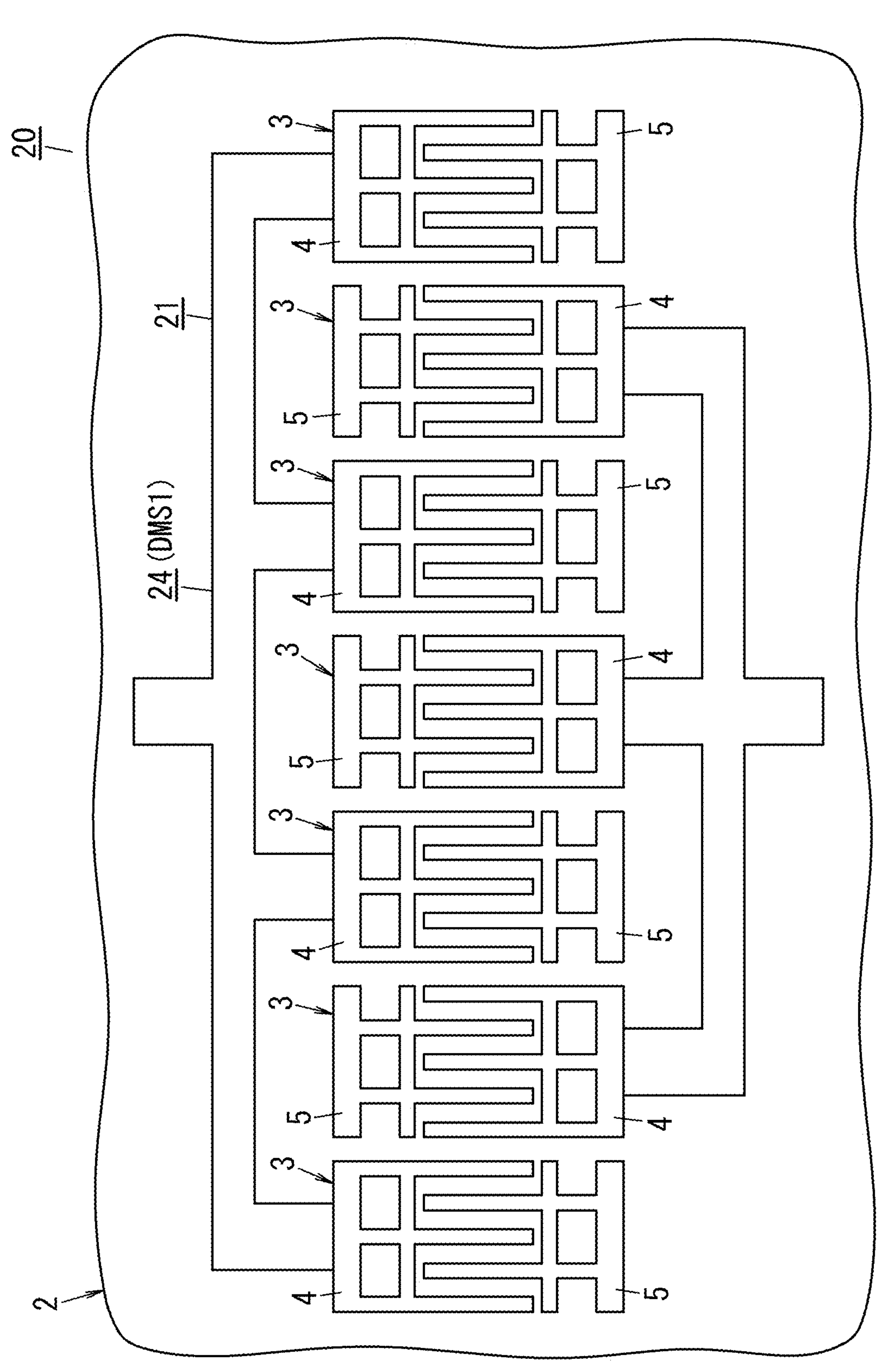
FIG. 8 is a plan view of a longitudinally coupled resonator of a second acoustic wave filter device according to an example embodiment of the present invention.

As shown in FIG. 8, the longitudinally coupled resonator DMS1 is a 7IDT type longitudinally coupled resonator in which seven IDT electrodes 3 are disposed in the propagation direction of the acoustic wave. The longitudinally coupled resonator DMS1 includes the regions A0 to A10 for each of the seven IDT electrodes 3. A shape of each of the seven IDT electrodes 3 is the same as that of the first acoustic wave resonator 21. In addition, in FIG. 8, the first mass addition film 8 and the second mass addition film 9 are omitted in the illustration.

The number of the IDT electrodes 3 of the longitudinally coupled resonator DMS1 is not limited to seven, and may be three or five, for example.

(5) Characteristics of First Acoustic Wave Filter Device

In frequency characteristics of impedance of each of the first acoustic wave resonator 11 and the second acoustic wave resonator 12, it is possible to reduce or prevent ripple (transverse mode ripple) of unnecessary waves generated between a resonant point and an anti-resonant point.

The Q value of the first acoustic wave resonator 11 is greater than the Q value of the second acoustic wave resonator 12.

The first acoustic wave filter device 100 can reduce or prevent a loss in filter characteristics (attenuation characteristics), compared to when all of the plurality of acoustic wave resonators 14 are the first acoustic wave resonators 11.

(6) Characteristics of Second Acoustic Wave Filter Device

In the frequency characteristics of the impedance of each of the first acoustic wave resonator 21 and the second acoustic wave resonator 22, it is possible to reduce or prevent ripple (transverse mode ripple) of unnecessary waves generated between the resonant point and the anti-resonant point.

The Q value of the first acoustic wave resonator 21 is greater than the Q value of the second acoustic wave resonator 22.

The second acoustic wave filter device 200 can reduce or prevent the loss in the filter characteristics (attenuation characteristics), compared to when all of the plurality of acoustic wave resonators 24 are the first acoustic wave resonators 21.

(7) Advantageous Effect

The first acoustic wave filter device 100 according to Example Embodiment 1 includes the plurality of acoustic wave resonators 14. Each of the plurality of acoustic wave resonators 14 includes the piezoelectric substrate 2 and the IDT electrode 3. The IDT electrode 3 is provided on the piezoelectric substrate 2. The IDT electrode 3 includes the first busbar 4, the second busbar 5, the plurality of first electrode fingers 6, and the plurality of second electrode fingers 7. The second busbar 5 faces the first busbar 4 in the predetermined direction D1. The plurality of first electrode fingers 6 extend from the first busbar 4 toward the second busbar 5 in the first direction D1. The plurality of second electrode fingers 7 extend from the second busbar 5 toward the first busbar 4 in the predetermined direction. The region between the envelope 36 of the tip edge of the plurality of first electrode fingers 6 and the envelope 37 of the tip edge of the plurality of second electrode fingers 7 is defined as the intersecting region 30, and the wavelength of the acoustic wave determined by the electrode finger pitch of the IDT electrode 3 is defined as A. In a plan view in the thickness direction DO of the piezoelectric substrate 2, each of the plurality of acoustic wave resonators 14 includes the central region (region A0), the first region (region A1), and the second region (region A2). The central region (region A0) includes the central portion 300 of the intersecting region 30 of the IDT electrode 3 in the predetermined direction. The first region (region A1) includes the tip end portion 61 of the plurality of first electrode fingers 6, and has the lower acoustic velocity of the acoustic wave than that of the central region (region A0). The second region (region A2) includes the tip end portion 71 of the plurality of second electrode fingers 7, and has the lower acoustic velocity of the acoustic wave than that of the central region (region A0). The plurality of acoustic wave resonators 14 include a first acoustic wave resonator 11 and a second acoustic wave resonator 12. The piezoelectric substrate 2 of the first acoustic wave resonator 11 and the piezoelectric substrate 2 of the second acoustic wave resonator 12 are the same. The first acoustic wave resonator 11 further includes the third region (region A7) and the fourth region (region A8). The third region (region A7) includes the gap 50 having the length of about 0.3λ or longer in the predetermined direction outside of the first region (region A1) in the predetermined direction, and has the higher acoustic velocity of the acoustic wave than that of the central region (region A0). The fourth region (region A8) includes the gap 40 having the length of about 0.3λ or longer in the predetermined direction D1 outside of the second region (region A2) in the predetermined direction D1, and has the higher acoustic velocity of the acoustic wave than that of the central region (region A0). The second acoustic wave resonator 12 does not include the third region (region A7) and the fourth region (region A8).

According to the above-described configuration, it is possible to achieve both characteristics and size reduction.

In addition, the acoustic wave filter device 100 according to Example Embodiment 1 further includes the first input-output electrode 15 and the second input-output electrode 16. The plurality of acoustic wave resonators 14 include two or more acoustic wave resonators 14 (series arm resonators S1 to S5) provided in the signal path 156 between the first input-output electrode 15 and the second input-output electrode 16, and two or more acoustic wave resonators 14 (parallel arm resonators P1 to P4) connected between the signal path 156 and the ground. The plurality of acoustic wave resonators 14 include at least two first acoustic wave resonators 11. At least two first acoustic wave resonators 11 include the acoustic wave resonators 14 (series arm resonator S4) having the largest electrode finger pitch in the two or more acoustic wave resonators 14 (series arm resonators S1 to S5) provided in the signal path 156, and the acoustic wave resonator 14 (parallel arm resonator P2) having the smallest electrode finger pitch in two or more acoustic wave resonators 14 (parallel arm resonators P1 to P4) connected between the signal path 156 and the ground.

According to the above-described configuration, it is possible to achieve size reduction while reducing or preventing a loss in the filter characteristics.

The second acoustic wave filter device 200 according to Example Embodiment 1 includes the plurality of acoustic wave resonators 24. Each of the plurality of acoustic wave resonators 24 includes the piezoelectric substrate 2 and the IDT electrode 3. The IDT electrode 3 is provided on the piezoelectric substrate 2. The IDT electrode 3 includes the first busbar 4, the second busbar 5, the plurality of first electrode fingers 6, and the plurality of second electrode fingers 7. The second busbar 5 faces the first busbar 4 in the predetermined direction D1. The plurality of first electrode fingers 6 extend from the first busbar 4 toward the second busbar 5 in the first direction D1. The plurality of second electrode fingers 7 extend from the second busbar 5 toward the first busbar 4 in the predetermined direction. The region between the envelope 36 of the tip edge of the plurality of first electrode fingers 6 and the envelope 37 of the tip edge of the plurality of second electrode fingers 7 is defined as the intersecting region 30, and the wavelength of the acoustic wave determined by the electrode finger pitch of the IDT electrode 3 is defined as A. In a plan view in the thickness direction DO of the piezoelectric substrate 2, each of the plurality of acoustic wave resonators 24 includes the central region (region A0), the first region (region A1), and the second region (region A2). The central region (region A0) includes the central portion 300 of the intersecting region 30 of the IDT electrode 3 in the predetermined direction D1. The first region (region A1) includes the tip end portion 61 of the plurality of first electrode fingers 6, and has the lower acoustic velocity of the acoustic wave than that of the central region (region A0). The second region (region A2) includes the tip end portion 71 of the plurality of second electrode fingers 7, and has the lower acoustic velocity of the acoustic wave than that of the central region (region A0). The plurality of acoustic wave resonators 24 include a first acoustic wave resonator 21 and a second acoustic wave resonator 22. The piezoelectric substrate 2 of the first acoustic wave resonator 21 and the piezoelectric substrate 2 of the second acoustic wave resonator 22 are the same. The first acoustic wave resonator 21 further includes the third region (region A7) and the fourth region (region A8). The third region (region A7) includes the gap 50 having the length of about 0.3λ or longer in the predetermined direction D1 outside of the first region (region A1) in the predetermined direction D1, and has the higher acoustic velocity of the acoustic wave than that of the central region (region A0). The fourth region (region A8) includes the gap 40 having the length of about 0.3λ or longer in the predetermined direction D1 outside of the second region (region A2) in the predetermined direction D1, and has the higher acoustic velocity of the acoustic wave than that of the central region (region A0). The second acoustic wave resonator 22 does not include the third region (region A7) and the fourth region (region A8).

According to the above-described configuration, it is possible to achieve both characteristics and size reduction.

In addition, the second acoustic wave filter device 200 according to Example Embodiment 1 further includes the first input-output electrode 25 and the second input-output electrode 26. The plurality of acoustic wave resonators 24 include two or more acoustic wave resonators 24 (series arm resonators S11 to S13) provided in the signal path 256 between the first input-output electrode 25 and the second input-output electrode 26, and two or more acoustic wave resonators 14 (parallel arm resonators P11 to P13) connected between the signal path 256 and the ground. The plurality of acoustic wave resonators 24 include at least two first acoustic wave resonators 21. At least two first acoustic wave resonators 21 include the acoustic wave resonators 24 (series arm resonator S12) having the largest electrode finger pitch in the two or more acoustic wave resonators 24 (series arm resonators S11 to S13) provided in the signal path 256, and the acoustic wave resonator 24 (parallel arm resonator P12) having the smallest electrode finger pitch in two or more acoustic wave resonators 24 (parallel arm resonators P11 to P13) connected between the signal path 256 and the ground.

According to the above-described configuration, it is possible to achieve size reduction while reducing or preventing a loss in the filter characteristics.

(8) Modification Example

Figure 9:
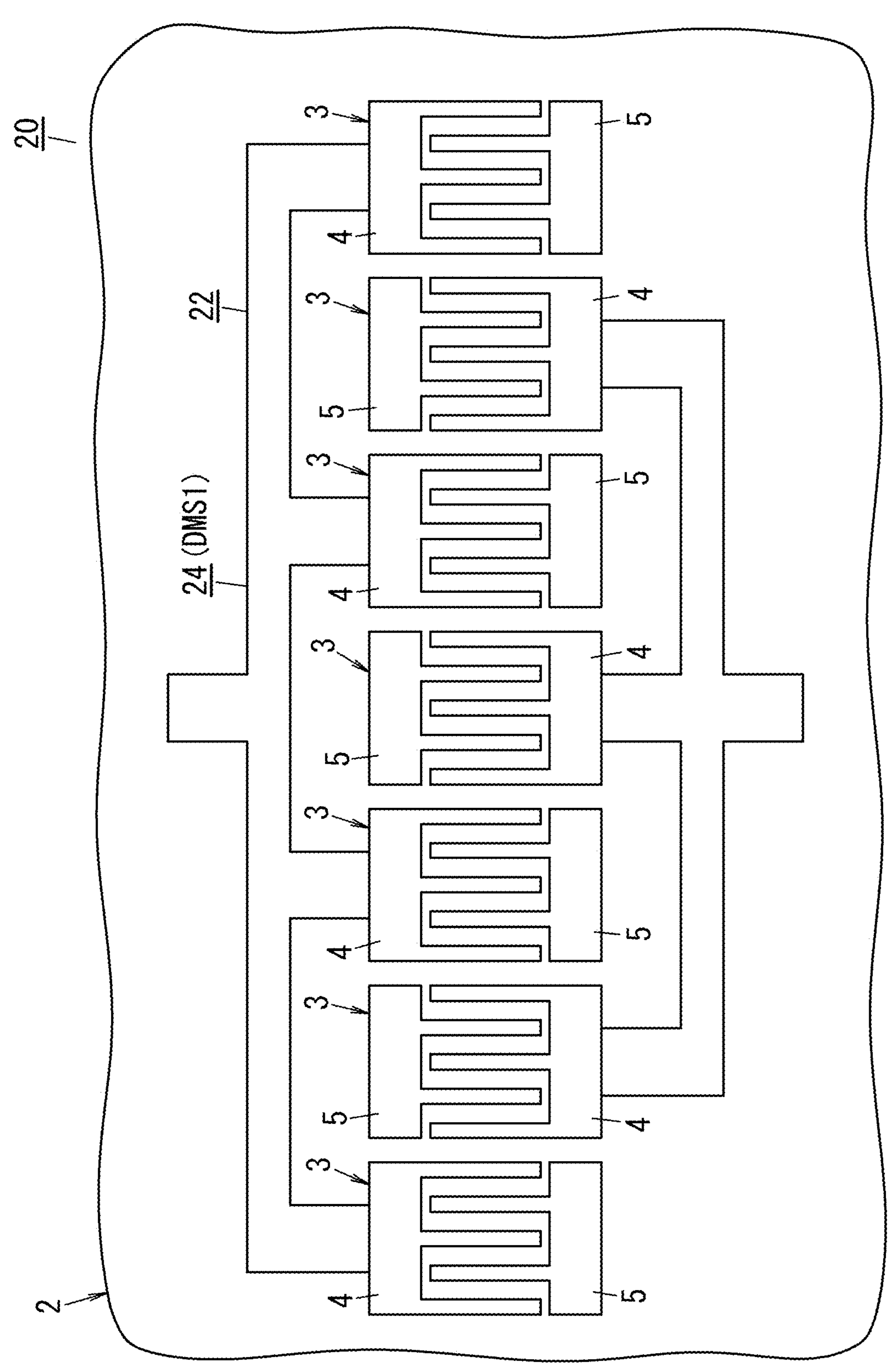
FIG. 9 is a plan view of a longitudinally coupled resonator according to a modification example of a second acoustic wave filter device according to an example embodiment of the present invention.

In the longitudinally coupled resonator DMS1 in a modification example, as shown in FIG. 9, a shape of each of the seven IDT electrodes 3 is the same as that of the second acoustic wave resonator 22. In FIG. 9, the first mass addition film 8 and the second mass addition film 9 are omitted in the illustration.

Example Embodiment 2

The circuit configurations of the first acoustic wave filter device 100, the second acoustic wave filter device 200, and the high frequency module 500 according to Example Embodiment 2 are the same as the respective circuit configurations of the first acoustic wave filter device 100, the second acoustic wave filter device 200, and the high frequency module 500 according to Example Embodiment 1 shown in FIG. 1, and thus, illustration and description thereof are omitted.

(1) Structure of First Acoustic Wave Filter Device

Figures 10A, 10B:
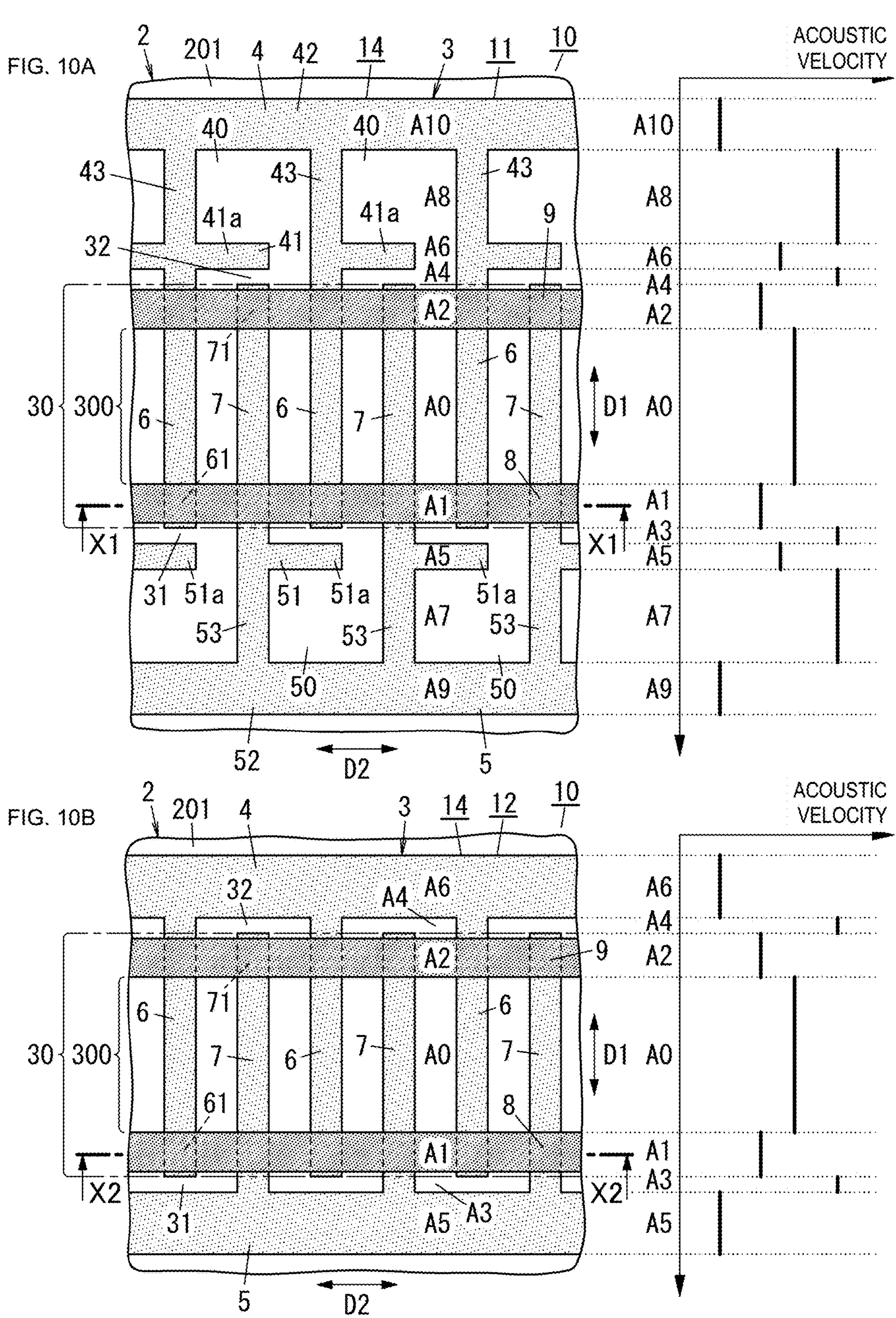
FIG. 10A is a schematic view for describing a velocity distribution in a predetermined direction, in an acoustic velocity of an acoustic wave propagating in the acoustic wave propagation direction in a first acoustic wave resonator of an acoustic wave filter device according to Example Embodiment 2 of the present invention.
FIG. 10B is a schematic view for describing a velocity distribution in a predetermined direction, in an acoustic velocity of an acoustic wave propagating in the acoustic wave propagation direction in a second acoustic wave resonator of an acoustic wave device according to an example embodiment of the present invention.

In the acoustic wave filter device 100 according to Example Embodiment 2, the structure of the first acoustic wave resonator 11 shown in FIG. 10A is different from the structure of the first acoustic wave resonator 11 in the acoustic wave filter device 100 according to Example Embodiment 1.

The first acoustic wave resonator 11 of the present example embodiment is different from the first acoustic wave resonator 11 of Example Embodiment 1 in that the inner busbar portion 41 includes a plurality of isolation inner busbar portions 41*a* separated in the second direction D2. In the present example embodiment, the inner busbar portion 41 includes a slit through which the gap 32 and the gap 40 communicate with each other, and is discontinuous in the second direction D2.

The first acoustic wave resonator 11 of the present example embodiment is different from the first acoustic wave resonator 11 of Example Embodiment 1 in that the inner busbar portion 51 includes a plurality of isolation inner busbar portions 51*a* separated in the second direction D2. In the present example embodiment, the inner busbar portion 51 includes a slit through which the gap 32 and the gap 50 communicate with each other, and is discontinuous in the second direction D2.

The structure of the second acoustic wave resonator 12 shown in FIG. 10B is the same as the structure of the second acoustic wave resonator 12 of Example Embodiment 1, and thus, description thereof is omitted.

(2) Advantageous Effects

The first acoustic wave filter device 100 according to Example Embodiment 2 achieves the same advantageous effects as those achieved by the first acoustic wave filter device 100 according to Example Embodiment 1.

Example Embodiment 3

The circuit configurations of the first acoustic wave filter device 100, the second acoustic wave filter device 200, and the high frequency module 500 according to Example Embodiment 3 are the same as the respective circuit configurations of the first acoustic wave filter device 100, the second acoustic wave filter device 200, and the high frequency module 500 according to Example Embodiment 1 shown in FIG. 1, and thus, illustration and description thereof are omitted.

(1) Structure of First Acoustic Wave Filter Device

Figures 11A, 11B:
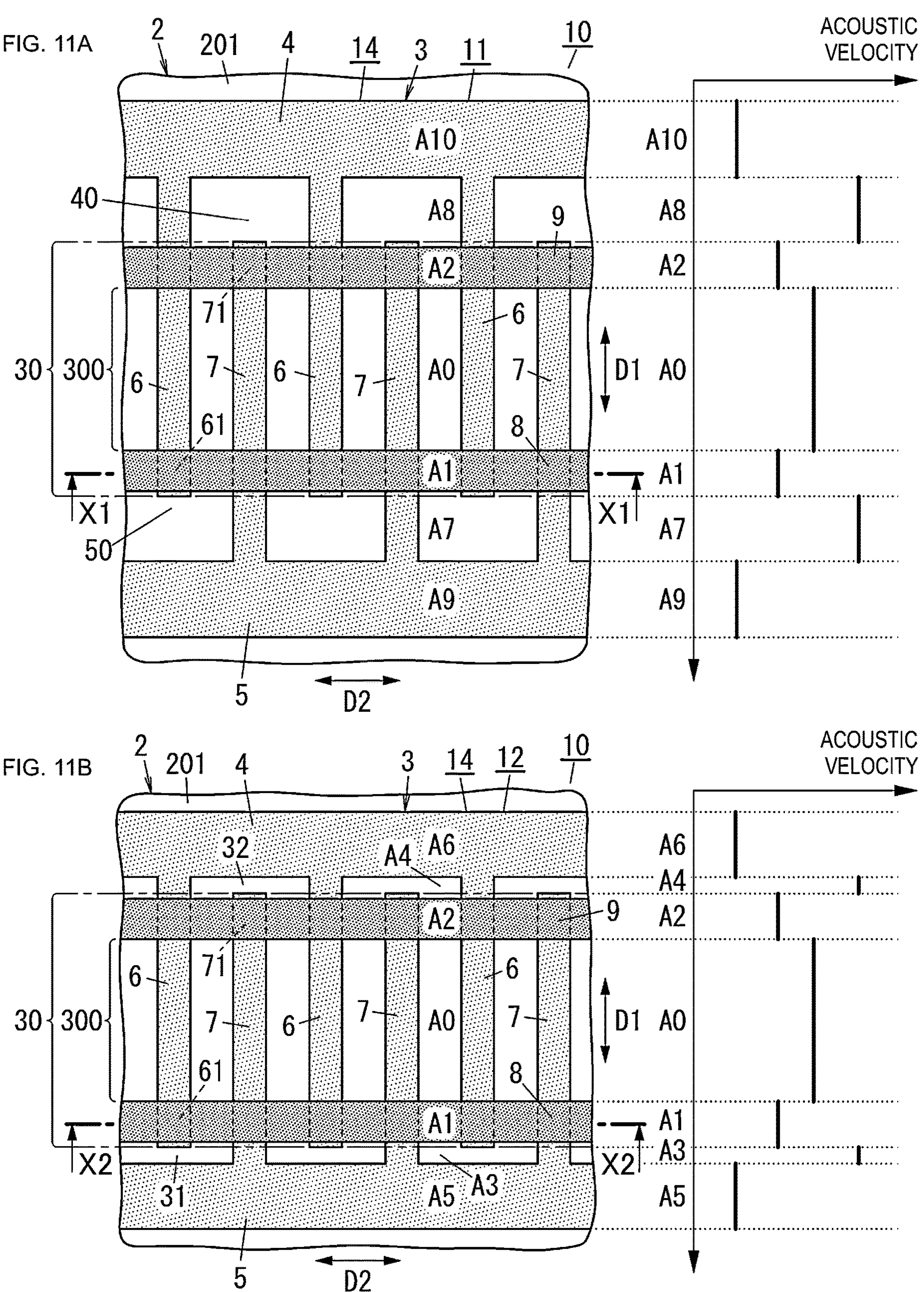
FIG. 11A is a schematic view for describing a velocity distribution in a predetermined direction of an acoustic velocity of an acoustic wave propagating in the acoustic wave propagation direction in a first acoustic wave resonator of an acoustic wave filter device according to Example Embodiment 3 of the present invention.
FIG. 11B is a schematic view for describing a velocity distribution in a predetermined direction, in an acoustic velocity of an acoustic wave propagating in the acoustic wave propagation direction in a second acoustic wave resonator of an acoustic wave device according to the example embodiment of the present invention.

In the acoustic wave filter device 100 according to Example Embodiment 3, the structure of the first acoustic wave resonator 11 shown in FIG. 11A is different from the structure of the first acoustic wave resonator 11 in the acoustic wave filter device 100 according to Example Embodiment 1.

The first acoustic wave resonator 11 of the present example embodiment is different from the first acoustic wave resonator 11 of Example Embodiment 1 in the following points. The first acoustic wave resonator 11 of the present example embodiment does not adopt a structure in which the second busbar 5 is divided into the inner busbar portion 51 and the outer busbar portion 52 as in the first acoustic wave resonator 11 of Example Embodiment 1, and includes the third region (region A7) having the gap 50 having the length of about 0.3λ or longer in the predetermined direction outside of the first region (region A1) in the predetermined direction D1. In the present example embodiment, the gap 40 is a gap between the first electrode finger 6 and the second busbar 5 in the first direction D1.

In addition, the first acoustic wave resonator 11 of the present example embodiment is different from the first acoustic wave resonator 11 of Example Embodiment 1 in the following points. The first acoustic wave resonator 11 of the present example embodiment does not adopt a structure in which the first busbar 4 is divided into the inner busbar portion 41 and the outer busbar portion 42 as in the first acoustic wave resonator 11 of Example Embodiment 1, and includes the fourth region (region A8) having the gap 40 having the length of about 0.3λ or longer in the predetermined direction outside of the second region (region A2) in the predetermined direction D1. In the present example embodiment, the gap 50 is a gap between the second electrode finger 7 and the first busbar 4 in the first direction D1.

The structure of the second acoustic wave resonator 12 shown in FIG. 11B is the same as that of the second acoustic wave resonator 12 according to Example Embodiment 1, and thus, description thereof is omitted.

(2) Advantageous Effects

The first acoustic wave filter device 100 according to Example Embodiment 3 achieves the same advantageous effects as those achieved by the first acoustic wave filter device 100 according to Example Embodiment 1.

Example Embodiment 4

The circuit configurations of the first acoustic wave filter device 100, the second acoustic wave filter device 200, and the high frequency module 500 according to Example Embodiment 4 are the same as the respective circuit configurations of the first acoustic wave filter device 100, the second acoustic wave filter device 200, and the high frequency module 500 according to Example Embodiment 1 shown in FIG. 1, and thus, illustration and description thereof are omitted.

(1) Structure of First Acoustic Wave Filter Device

Figures 12A, 12B:
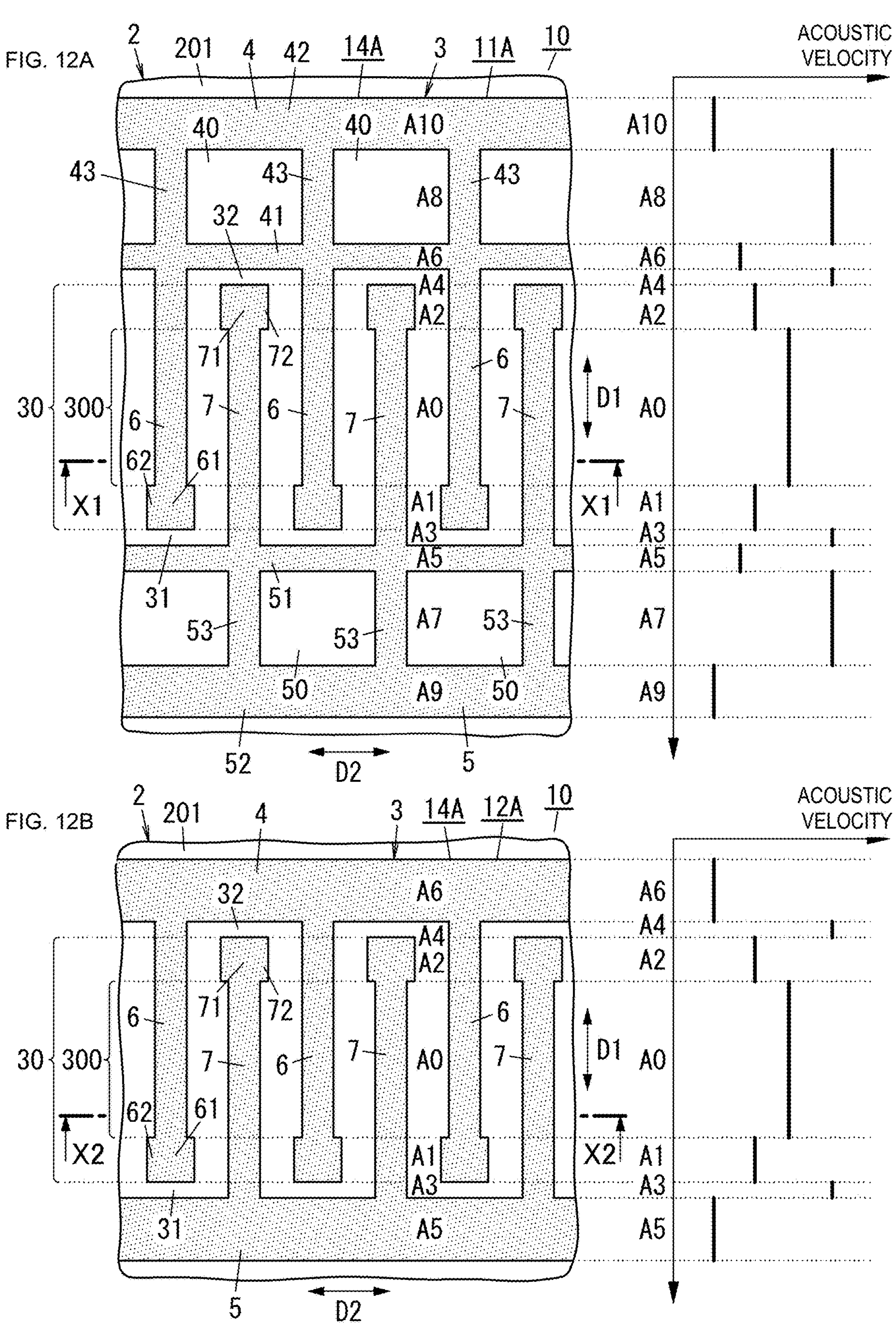
FIG. 12A is a schematic view for describing a velocity distribution in a predetermined direction, in an acoustic velocity of an acoustic wave propagating in the acoustic wave propagation direction in a first acoustic wave resonator of an acoustic wave filter device according to Example Embodiment 4 of the present invention.
FIG. 12B is a schematic view for describing a velocity distribution in a predetermined direction, in an acoustic velocity of an acoustic wave propagating in the acoustic wave propagation direction in the second acoustic wave resonator of a acoustic wave device according to an example embodiment of the present invention.
Figure 13A:
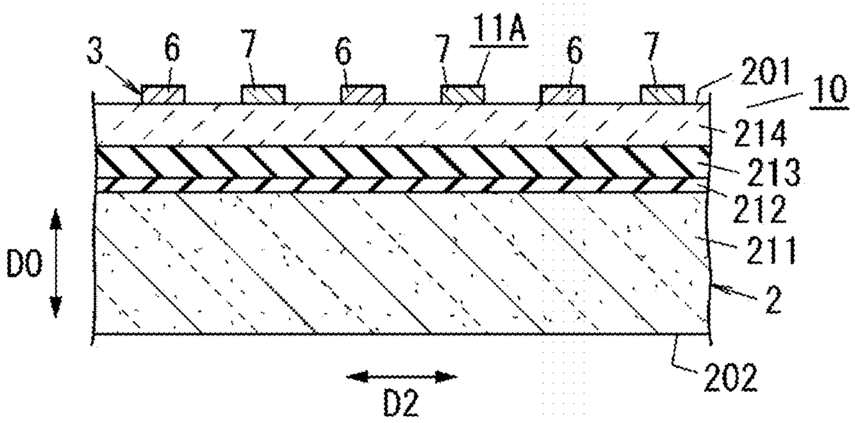
FIG. 13A relates to the first acoustic wave resonator of an acoustic wave filter device according to an example embodiment of the present invention, and is a sectional view taken along line X1-X1 in FIG. 12A.
Figure 13B:
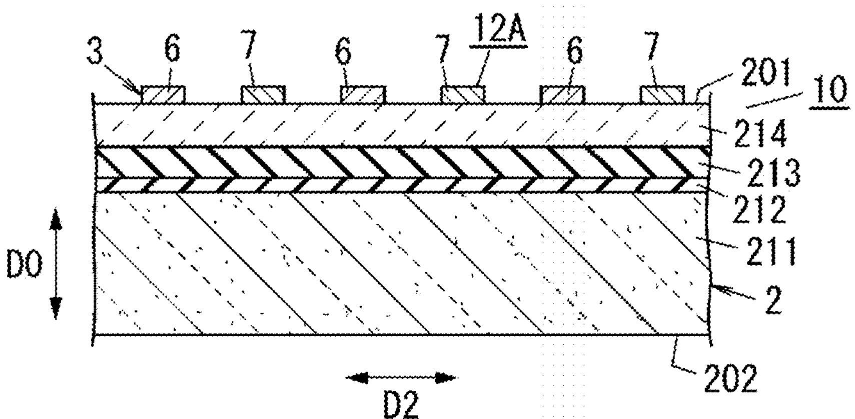
FIG. 13B relates to the second acoustic wave resonator of an acoustic wave filter device according to an example embodiment of the present invention, and is a sectional view taken along line X2-X2 in FIG. 12B.

The first acoustic wave filter device 100 according to Example Embodiment 4 includes a plurality of acoustic wave resonators 14A instead of the plurality of acoustic wave resonators 14. With regard to the acoustic wave resonator 14A, the same reference numerals are assigned to components the same as those of the acoustic wave resonator 14, and description thereof is omitted. In the first acoustic wave filter device 100 according to Example Embodiment 4, as shown in FIGS. 12A and 13A, the structure of a first acoustic wave resonator 11A is different from the structure of the first acoustic wave resonator 11 in the acoustic wave filter device 100 according to Example Embodiment 1. In addition, in the first acoustic wave filter device 100 according to Example Embodiment 4, as shown in FIGS. 12B and 13B, the structure of a second acoustic wave resonator 12A is different from the structure of the second acoustic wave resonator 12 in the acoustic wave filter device 100 according to Example Embodiment 1.

In the first acoustic wave resonator 11A of the present example embodiment, instead of providing the first mass addition film 8 in the first acoustic wave resonator 11 of Example Embodiment 1, the tip end portion 61 of the plurality of first electrode fingers 6 includes a wide portion 62 (first wide portion 62). In addition, in the first acoustic wave resonator 11A of the present example embodiment, instead of providing the second mass addition film 9 in the first acoustic wave resonator 11 of Example Embodiment 1, the tip end portion 71 of the plurality of second electrode fingers 7 includes a wide portion 72 (second wide portion). In the plurality of first electrode fingers 6, the width of the wide portion 62 in the second direction D2 is wider than the width W60 of the central portion 60 in the second direction D2. It is preferable that the length of the wide portion 62 in the predetermined direction D1 is shorter than about 1.5λ, for example. In the plurality of second electrode fingers 7, the width of the wide portion 72 in the second direction D2 is wider than the width W70 of the central portion 70 in the second direction D2. It is preferable that the length of the wide portion 72 in the predetermined direction D1 is shorter than about 1.5λ, for example.

The first acoustic wave resonator 11A of the present example embodiment includes the first region (region A1) including the tip end portion 61 of the plurality of first electrode fingers 6 without providing the first mass addition film 8 in the first acoustic wave resonator 11 of Example Embodiment 1. In addition, the first acoustic wave resonator 11A of the present example embodiment includes the second region (region A2) including the tip end portion 71 of the plurality of second electrode fingers 7 without providing the second mass addition film 9 in the first acoustic wave resonator 11 of Example Embodiment 1.

The second acoustic wave resonator 12A of the present example embodiment includes the first region (region A1) including the tip end portion 61 of the plurality of first electrode fingers 6 without providing the first mass addition film 8 in the second acoustic wave resonator 12 of Example Embodiment 1. In addition, the second acoustic wave resonator 12A of the present example embodiment includes the second region (region A2) including the tip end portion 71 of the plurality of second electrode fingers 7 without providing the second mass addition film 9 in the second acoustic wave resonator 12 of Example Embodiment 1.

(2) Advantageous Effects

The first acoustic wave filter device 100 according to Example Embodiment 4 achieves the same advantageous effects as those achieved by the first acoustic wave filter device 100 according to Example Embodiment 1.

Example Embodiment 5

Figure 14:
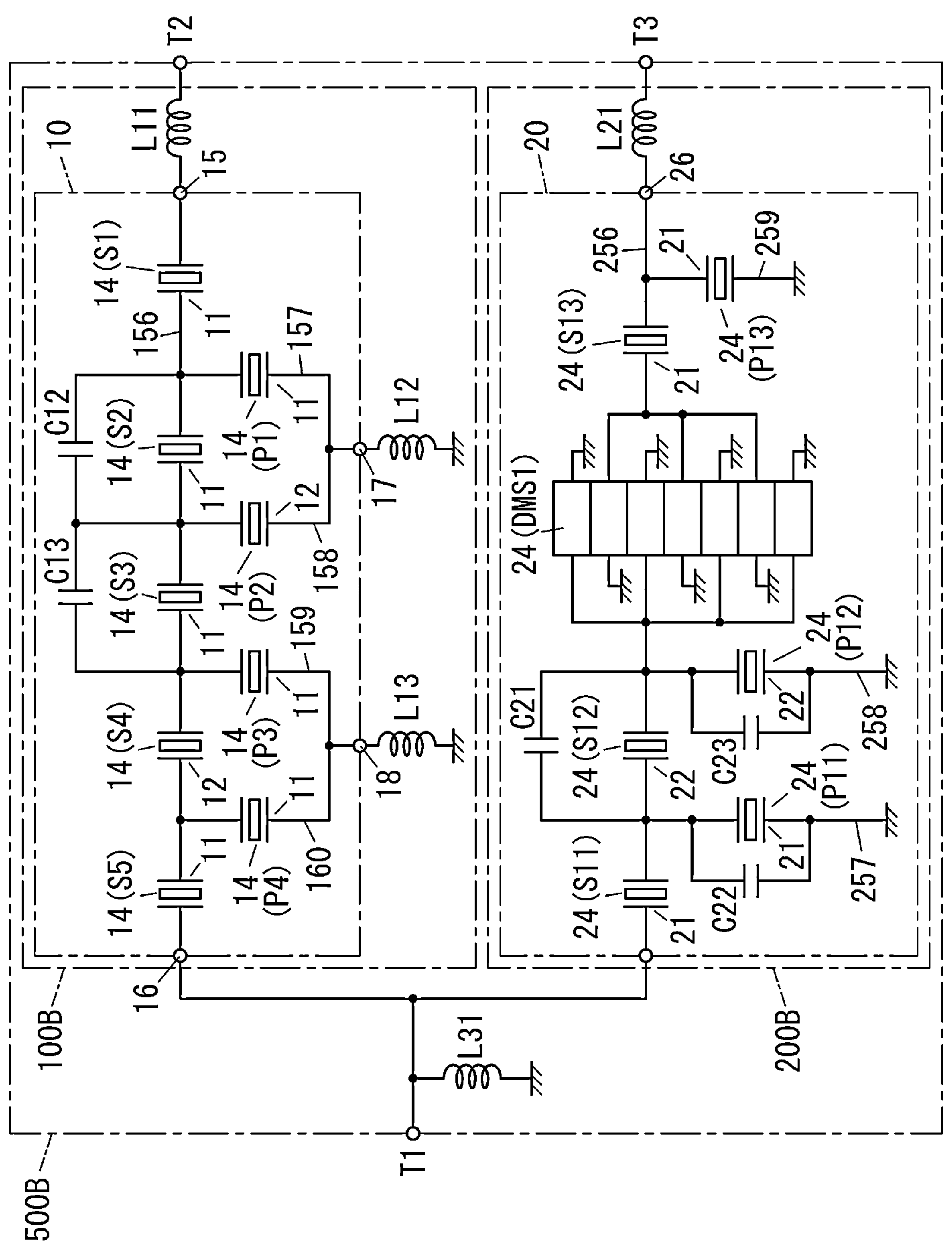
FIG. 14 is a circuit diagram of a high frequency module including an acoustic wave filter device according to Example Embodiment 5 of the present invention.

A first acoustic wave filter device 100B, a second acoustic wave filter device 200B, and a high frequency module 500B according to Example Embodiment 5 will be described with reference to FIG. 14. With regard to the first acoustic wave filter device 100B, the second acoustic wave filter device 200B, and the high frequency module 500B according to Example Embodiment 5, the same reference numerals are assigned to components the same as those of the first acoustic wave filter device 100, the second acoustic wave filter device 200, and the high frequency module 500 according to Example Embodiment 1 shown in FIG. 1, and thus, description thereof is omitted.

(1) Configuration

The first acoustic wave filter device 100B is different from the first acoustic wave filter device 100 in that the series arm resonator S4 includes the second acoustic wave resonator 12, and the series arm resonator S1 includes the first acoustic wave resonator 11.

The second acoustic wave filter device 200B is different from the second acoustic wave filter device 200 in that the series arm resonator S13 includes the second acoustic wave resonator 22, and the series arm resonator S12 includes the first acoustic wave resonator 21.

The high frequency module 500B is different from the high frequency module 500 in that the high frequency module 500B includes the first acoustic wave filter device 100B and the second acoustic wave filter device 200B, instead of the first acoustic wave filter device 100 and the second acoustic wave filter device 200 of the high frequency module 500 according to Example Embodiment 1.

(2) Advantageous Effects

The first acoustic wave filter device 100B according to Example Embodiment 5 further includes the first input-output electrode 15 and the second input-output electrode 16. The plurality of acoustic wave resonators 14 include two or more acoustic wave resonators 14 (series arm resonators S1 to S5) provided in the signal path 156 between the first input-output electrode 15 and the second input-output electrode 16, and two or more acoustic wave resonators 14 (parallel arm resonators P1 to P4) connected between the signal path 156 and the ground. In the plurality of acoustic wave resonators 14, the second acoustic wave resonator 12 includes the acoustic wave resonator 14 (series arm resonator S4) having the largest electrode finger pitch in two or more acoustic wave resonators 14 (series arm resonators S1 to S5) provided in the signal path 156, or the acoustic wave resonator 14 (parallel arm resonator P2) having the smallest electrode finger pitch of two or more acoustic wave resonators 14 (parallel arm resonators P1 to P4) connected between the signal path 156 and the ground.

According to the above-described configuration, while electric power handling capability can be improved, size reduction can be achieved.

Example Embodiment 6

The circuit configurations of the first acoustic wave filter device 100, the second acoustic wave filter device 200, and the high frequency module 500 according to Example Embodiment 6 are the same as the respective circuit configurations of the first acoustic wave filter device 100, the second acoustic wave filter device 200, and the high frequency module 500 according to Example Embodiment 1 shown in FIG. 1, and thus, illustration and description thereof are omitted.

(1) Structure of First Acoustic Wave Filter Device

Figures 15A, 15B:
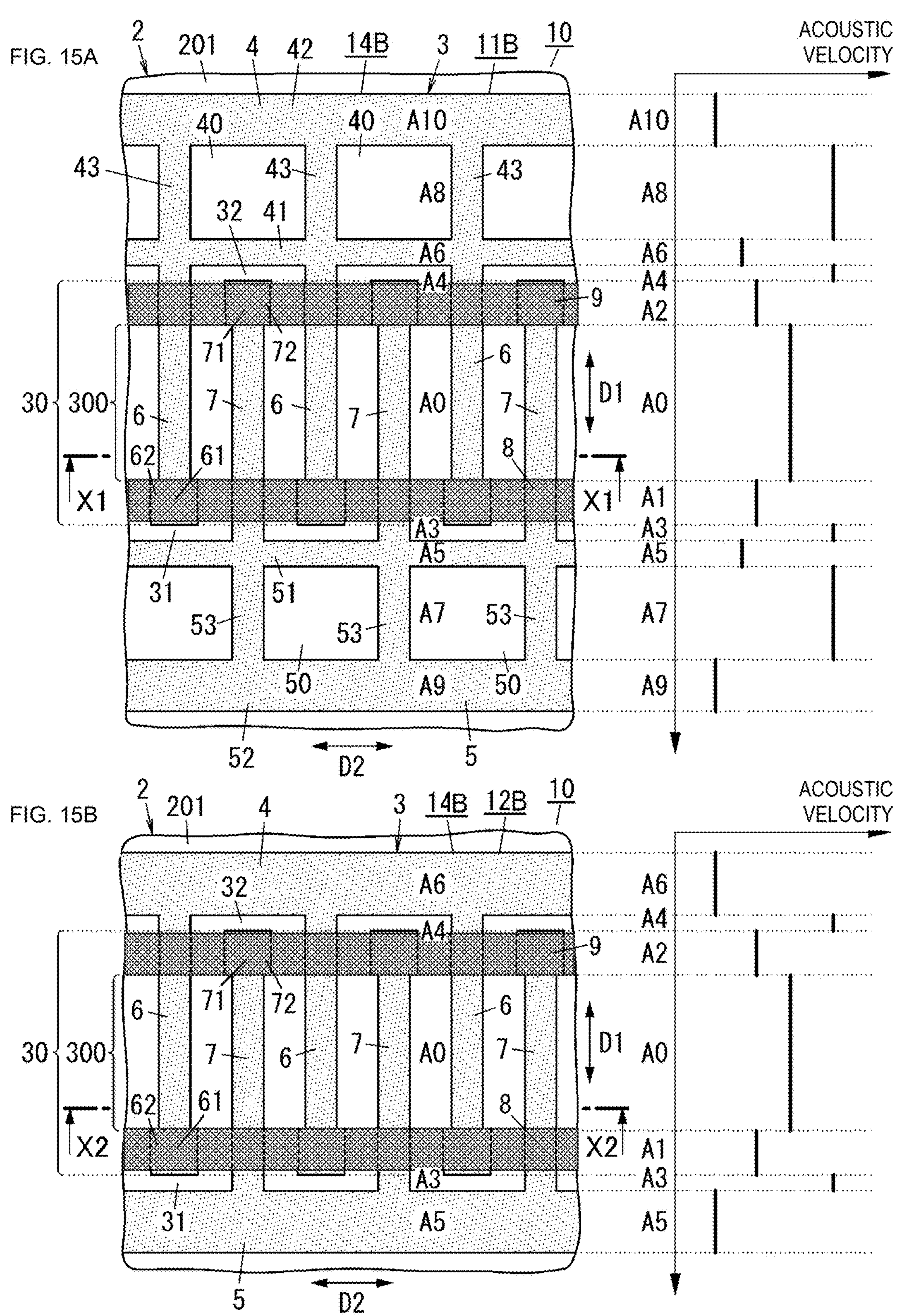
FIG. 15A is a schematic view for describing a velocity distribution in a predetermined direction, in an acoustic velocity of an acoustic wave propagating in the acoustic wave propagation direction in a first acoustic wave resonator of an acoustic wave filter device according to Example Embodiment 6 of the present invention.
FIG. 15B is a schematic view for describing a velocity distribution in a predetermined direction, in an acoustic velocity of an acoustic wave propagating in the acoustic wave propagation direction in the second acoustic wave resonator of an acoustic wave device according to an example embodiment of the present invention.

The first acoustic wave filter device 100 according to Example Embodiment 6 includes a plurality of acoustic wave resonators 14B instead of the plurality of acoustic wave resonators 14 or 14A. With regard to the acoustic wave resonator 14B, the same reference numerals are assigned to components the same as or corresponding to those of the acoustic wave resonators 14 and 14A, and description thereof is omitted. In the first acoustic wave filter device 100 according to Example Embodiment 6, as shown in FIG. 15A, the structure of a first acoustic wave resonator 11B is different from the structure of the first acoustic wave resonator 11A in the acoustic wave filter device 100 according to Example Embodiment 4. In addition, in the first acoustic wave filter device 100 according to Example Embodiment 6, as shown in FIG. 15B, the structure of a second acoustic wave resonator 12B is different from the structure of the second acoustic wave resonator 12A in the acoustic wave filter device 100 according to Example Embodiment 4.

In the first acoustic wave resonator 11B of the present example embodiment, the first acoustic wave resonator 11B includes the first mass addition film 8 overlapping the tip end portion 61 of each of the plurality of first electrode fingers 6 and the tip end portion 61 of the plurality of first electrode fingers 6 includes the wide portion 62 (first wide portion). In addition, in the first acoustic wave resonator 11B of the present example embodiment, the first acoustic wave resonator 11B includes the second mass addition film 9 overlapping the tip end portion 71 of each of the plurality of second electrode fingers 7 and the tip end portion 71 of the plurality of second electrode fingers 7 includes the wide portion 72 (second wide portion).

In the second acoustic wave resonator 12B of the present example embodiment, the second acoustic wave resonator 12B includes the first mass addition film 8 overlapping the tip end portion 61 of each of the plurality of first electrode fingers 6 and the tip end portion 61 of the plurality of first electrode fingers 6 includes the wide portion 62 (first wide portion). In addition, in the second acoustic wave resonator 12B of the present example embodiment, the second acoustic wave resonator 12B includes the second mass addition film 9 overlapping the tip end portion 71 of each of the plurality of second electrode fingers 7 and the tip end portion 71 of the plurality of second electrode fingers 7 includes the wide portion 72 (second wide portion).

(2) Advantageous Effects

The first acoustic wave filter device 100 according to Example Embodiment 6 achieves the same or substantially the same advantageous effects as those achieved by the first acoustic wave filter device 100 according to Example Embodiment 1.

Example Embodiments 1 to 5 described above are merely one of various example embodiments of the present invention. Various modifications of Example Embodiments 1 to 5 described above can be made.

For example, in each of the plurality of acoustic wave resonators 14 in the acoustic wave filter device 100, the first mass addition film 8 may overlap at least a portion of the tip end portion 61 of at least one first electrode finger 6 in the plurality of first electrode fingers 6. The second mass addition film 9 may overlap at least a portion of the tip end portion 71 of at least one second electrode finger 7 in the plurality of second electrode fingers 7.

In addition, in each of the acoustic wave resonators 14A, at least one first electrode finger 6 in the plurality of first electrode fingers 6 may include the wide portion 62, and it is not essential that all of the plurality of first electrode fingers 6 include the wide portion 62. In addition, in each of the plurality of acoustic wave resonators 14A in the acoustic wave filter device 100B, at least one second electrode finger 7 in the plurality of second electrode fingers 7 may include the wide portion 72, and it is not essential that all of the plurality of second electrode fingers 7 include the wide portion 72.

In addition, in the acoustic wave filter device 100B, the wide portion 62 included in the tip end portion 61 of the first electrode finger 6 may be provided in at least a portion of the tip end portion 61 of the first electrode finger 6 in the longitudinal direction of the first electrode finger 6. The wide portion 72 included in the tip end portion 71 of the second electrode finger 7 may be provided in at least a portion of the tip end portion 71 of the second electrode finger 7 in the longitudinal direction of the second electrode finger 7.

In addition, in the acoustic wave filter devices 100, 100A, and 100B, the IDT electrode 3 in each of the plurality of acoustic wave resonators 14 may adopt a configuration in which the plurality of first electrode fingers 6 and the plurality of second electrode fingers 7 are aligned and separated in the second direction D2, or may adopt a configuration in which the plurality of first electrode fingers 6 and the plurality of second electrode fingers 7 are not aligned and separated from each other. For example, in the IDT electrode 3, a region in which the first electrode finger 6 and the second electrode finger 7 are aligned one by one and separated, and a region in which two first electrode fingers 6 or two second electrode fingers 7 are aligned in the second direction D2 may be mixed.

In addition, the IDT electrode 3 is a normal IDT electrode. Without being limited thereto, the IDT electrode 3 may be an inclined IDT electrode, for example. Therefore, the second direction D2 may be a direction intersecting with the first direction D1.

In addition, without being limited to the short-circuit grating, each reflector may be an open grating or a positive-negative reflective grating, for example. In addition, in the acoustic wave filter devices 100, 100A, and 100B, the reflector is not an essential component.

In addition, in each of the plurality of acoustic wave resonators 14, the IDT electrode 3 is directly provided on the piezoelectric substrate 2. However, without being limited thereto, the IDT electrode 3 may be indirectly provided on the piezoelectric substrate 2. For example, in each of the plurality of acoustic wave resonators 14, the IDT electrode 3 may be provided on the piezoelectric substrate 2 by using a dielectric film.

The piezoelectric substrate 2 may include a close contact layer or a dielectric film as films other than the high acoustic velocity film 212, the low acoustic velocity film 213, and the piezoelectric body layer 214.

In addition, the piezoelectric substrate 2 may be a piezoelectric substrate. For example, a material of the piezoelectric substrate is lithium tantalate. However, without being limited thereto, the material may be lithium niobate, zinc oxide, or aluminum nitride, for example.

Aspects

The following aspects of example embodiments of the present invention are disclosed in the present specification.

The acoustic wave filter device (100; 100B) according to a first aspect includes the plurality of acoustic wave resonators (14). Each of the plurality of acoustic wave resonators (14) includes the piezoelectric substrate (2) and the IDT electrode (3). The IDT electrode (3) is provided on the piezoelectric substrate (2). The IDT electrode (3) includes the first busbar (4), the second busbar (5), the plurality of first electrode fingers (6), and the plurality of second electrode fingers (7). The second busbar (5) faces the first busbar (4) in the predetermined direction (D1). The plurality of first electrode fingers (6) extend from the first busbar (4) toward the second busbar (5) in the predetermined direction. The plurality of second electrode fingers (7) extend from the second busbar (5) toward the first busbar (4) in the predetermined direction. The region between the envelope (36) of the tip edges of the plurality of first electrode fingers (6) and the envelope (37) of the tip edges of the plurality of second electrode fingers (7) is defined as the intersecting region (30), and the wavelength of the acoustic wave determined by the electrode finger pitch of the IDT electrode (3) is defined as λ. In a plan view in the thickness direction (DO) of the piezoelectric substrate (2), each of the plurality of acoustic wave resonators (14) includes the central region (region A0), the first region (region A1), and the second region (region A2). The central region (region A0) includes the central portion (300) of the intersecting region (30) of the IDT electrode (3) in the predetermined direction. The first region (region A1) includes the tip end portions (61) of the plurality of first electrode fingers (6), and has the lower acoustic velocity of the acoustic wave than that of the central region (region A0). The second region (region A2) includes the tip end portions (71) of the plurality of second electrode fingers (7), and has the lower acoustic velocity of an acoustic wave than that of the central region (region A0). The plurality of acoustic wave resonators (14) include the first acoustic wave resonator (11) and the second acoustic wave resonator (12). The piezoelectric substrate (2) of the first acoustic wave resonator (11) and the piezoelectric substrate (2) of the second acoustic wave resonator (12) are the same. The first acoustic wave resonator (11) further includes the third region (region A7) and the fourth region (region A8). The third region (region A7) includes the gap (50) having the length of about 0.3λ or longer in the predetermined direction (D1) outside of the first region (region A1) in the predetermined direction (D1), and has the higher acoustic velocity of the acoustic wave than that of the central region (region A0). The fourth region (region A8) includes gap (40) having the length of about 0.3λ or longer in the predetermined direction (D1) outside of the second region (region A2) in the predetermined direction (D1), and has the higher acoustic velocity of the acoustic wave than that of the central region (region A0). The second acoustic wave resonator (12) does not include the third region (region A7) and the fourth region (region A8).

According to this aspect, both characteristics and size reduction can be achieved.

The acoustic wave filter device (100) according to a second aspect includes the plurality of acoustic wave resonators (14). Each of the plurality of acoustic wave resonators (14) includes the piezoelectric substrate (2) and the IDT electrode (3). The IDT electrode (3) is provided on the piezoelectric substrate. The IDT electrode (3) includes the first busbar (4), the second busbar (5), the plurality of first electrode fingers (6), and the plurality of second electrode fingers (7). The second busbar (5) faces the first busbar (4) in the predetermined direction (D1). The plurality of first electrode fingers (6) extend from the first busbar (4) toward the second busbar (5) in the predetermined direction. The plurality of second electrode fingers (7) extend from the second busbar (5) toward the first busbar (4) in the predetermined direction. The region between the envelope (36) of the tip edges of the plurality of first electrode fingers (6) and the envelope (37) of the tip edges of the plurality of second electrode fingers (7) is defined as the intersecting region (30), and the wavelength of the acoustic wave determined by the electrode finger pitch of the IDT electrode (3) is defined as A. In a plan view in the thickness direction (DO) of the piezoelectric substrate (2), each of the plurality of acoustic wave resonators (14) includes the central region (region A0), the first region (region A1), and the second region (region A2). The central region (region A0) includes the central portion (300) of the intersecting region (30) of the IDT electrode (3) in the predetermined direction (D1). The first region (region A1) includes the tip end portions (61) of the plurality of first electrode fingers (6), and includes the first mass addition film (8) overlapping at least a portion of the tip end portion (61) of at least one first electrode fingers (6) in the plurality of first electrode fingers (6). The second region (region A2) includes the tip end portions (71) of the plurality of second electrode fingers (7), and includes the first mass addition film (8) overlapping at least a portion of the tip end portion (71) of at least one second electrode finger (7) in the plurality of second electrode fingers (7). The tip end portion (61) of the plurality of first electrode fingers (6) is the portion including the tip edge of the first electrode fingers (6). The tip end portion (71) of the plurality of second electrode fingers (7) is the portion including the tip edge of the second electrode fingers (7). The plurality of acoustic wave resonators (14) include the first acoustic wave resonator (11) and the second acoustic wave resonator (12). The piezoelectric substrate (2) of the first acoustic wave resonator (11) and the piezoelectric substrate (2) of the second acoustic wave resonator (12) are the same. The first acoustic wave resonator (11) further includes the third region (region A7) and the fourth region (region A8). The third region (region A7) includes the gap (50) having the length of about 0.3λ or longer in the predetermined direction (D1) outside of the first region (region A1) in the predetermined direction (D1). The fourth region (region A8) includes the gap (40) having the length of about 0.3λ or longer in the predetermined direction (D1) outside of the second region (region A2) in the predetermined direction (D1). The second acoustic wave resonator (12) does not include the third region (region A7) and the fourth region (region A8).

According to this aspect, both characteristics and size reduction can be achieved.

The acoustic wave filter device (100B) according to a third aspect includes the plurality of acoustic wave resonators (14A). Each of the plurality of acoustic wave resonators (14A) includes the piezoelectric substrate (2) and the IDT electrode (3). The IDT electrode (3) is provided on the piezoelectric substrate (2). The IDT electrode (3) includes the first busbar (4), the second busbar (5), the plurality of first electrode fingers (6), and the plurality of second electrode fingers (7). The second busbar (5) faces the first busbar (4) in the predetermined direction (D1). The plurality of first electrode fingers (6) extend from the first busbar (4) toward the second busbar (5) in the predetermined direction (D1). The plurality of second electrode fingers (7) extend from the second busbar (5) toward the first busbar (4) in the predetermined direction (D1). The region between the envelope (36) of the tip edges of the plurality of first electrode fingers (6) and the envelope (37) of the tip edges of the plurality of second electrode fingers (7) is defined as the intersecting region (30), and the wavelength of the acoustic wave determined by the electrode finger pitch of the IDT electrode (3) is defined as A. In a plan view in the thickness direction (DO) of the piezoelectric substrate (2), each of the plurality of acoustic wave resonators (14A) includes the central region (region A0), the first region (region A1), and the second region (region A2). The central region (region A0) includes the central portion (300) of the intersecting region (30) of the IDT electrode (3) in the predetermined direction (D1). The first region (region A1) includes the tip end portion (61) of the plurality of first electrode fingers (6), and the tip end portion (61) of at least one first electrode finger (6) in the plurality of first electrode fingers (6) includes the first wide portion (62). The second region (region A2) includes the tip end portions (71) of the plurality of second electrode fingers (7), and the tip end portion (71) of at least one second electrode finger (7) in the plurality of second electrode fingers (7) includes the second wide portion (72). The width of the first wide portion (62) is wider than the width (W60) of the central portion (60) of at least one first electrode finger (6). The width of the second wide portion (72) is wider than the width of the central portion (70) of at least one second electrode finger (7). The plurality of acoustic wave resonators (14A) include the first acoustic wave resonator (11A) and the second acoustic wave resonator (12A). The piezoelectric substrate (2) of the first acoustic wave resonator (11A) and the piezoelectric substrate (2) of the second acoustic wave resonator (12A) are the same. The first acoustic wave resonator (11A) further includes the third region (region A7) and the fourth region (region A8). The third region (region A3) includes the gap (50) having the length of about 0.3λ or longer in the predetermined direction (D1) outside of the first region (region A1) in the predetermined direction (D1). The fourth region (region A8) includes the gap (40) having the length of about 0.3λ or longer in the predetermined direction (D1) outside of the second region (region A2) in the predetermined direction (D1). The second acoustic wave resonator (12A) does not include the third region (region A7) and the fourth region (region A8).

According to this aspect, both characteristics and size reduction can be achieved.

In any one of the first to third aspects, the acoustic wave filter device (100) according to a fourth aspect further includes the first input-output electrode (15) and the second input-output electrode (16). The plurality of acoustic wave resonators (14; 14A) include two or more acoustic wave resonators (14; 14A, series arm resonators S1 to S5) provided in the signal path (156) between the first input-output electrode (15) and the second input-output electrode (16), and two or more acoustic wave resonators (14; 14A, parallel arm resonators P1 to P4) connected between the signal path (156) and the ground. The plurality of acoustic wave resonators (14; 14A) include at least two first acoustic wave resonators (11; 11A) including the acoustic wave resonator (14; 14A, series arm resonator S4) having the largest electrode finger pitch in two or more acoustic wave resonators (14; 14A, series arm resonators S1 to S5) provided in the signal path (156), and the acoustic wave resonator (14; 14A, parallel arm resonator P2) having the smallest electrode finger pitch in two or more acoustic wave resonators (14; 14A, parallel arm resonators P1 to P4) connected between the signal path (156) and the ground.

According to this aspect, while a loss in the filter characteristics can be reduced or prevented, size reduction can be achieved.

In any one of the first to third aspects, the acoustic wave filter device (100B) according to a fifth aspect further includes the first input-output electrode (15) and the second input-output electrode (16). The plurality of acoustic wave resonators (14; 14A) include two or more acoustic wave resonators (14; 14A, series arm resonators S1 to S5) provided in the signal path (156) between the first input-output electrode (15) and the second input-output electrode (16), and two or more acoustic wave resonators (14; 14A, parallel arm resonators P1 to P4) connected between the signal path (156) and the ground. The plurality of acoustic wave resonators (14; 14A) include at least two second acoustic wave resonators (12; 12A) including the acoustic wave resonator (14; 14A, series arm resonator S4) having the largest electrode finger pitch in two or more acoustic wave resonators (14; 14A, series arm resonators S1 to S5) provided in the signal path (156), and the acoustic wave resonator (14; 14A, parallel arm resonator P2) having the smallest electrode finger pitch in two or more acoustic wave resonators (14; 14A, parallel arm resonator P1 to P4) connected between the signal path (156) and the ground.

According to this aspect, while electric power handling capability can be improved, size reduction can be achieved.

In the fourth or the fifth aspect, in the acoustic wave filter device (100B) according to a sixth aspect, at least a portion the frequency band between the resonant frequency and the anti-resonant frequency of at least two first acoustic wave resonators (11; 11A) is included in the pass band of the acoustic wave filter device (100B).

In the first aspect, in the acoustic wave filter device (100) according to a seventh aspect, the first region (region A1) includes) includes the first mass addition film (8) overlapping at least a portion of the tip end portion (61) of at least one first electrode finger (6) in the plurality of first electrode fingers (6). The second region (region A2) includes the second mass addition film (9) overlapping at least a portion of the tip end portion (71) of at least one second electrode finger (7) in the plurality of second electrode fingers (7). The tip end portion (61) of the plurality of first electrode fingers (6) is the portion including the tip edge of the first electrode fingers (6). The tip end portion (71) of the plurality of second electrode fingers (7) is the portion including the tip edge of the second electrode fingers (7).

According to this aspect, the first region (region A1) includes the first mass addition film (8). In this manner, the acoustic velocity in the first region (region A1) can be lower than the acoustic velocity in the central region (region A0). In addition, according to this aspect, the second region (region A2) includes the second mass addition film (9). In this manner, the acoustic velocity in the second region (region A2) can be lower than the acoustic velocity in the central region (region A0).

According to this aspect, it is possible to reduce or prevent ripple of unnecessary waves.

In the first aspect, in the acoustic wave filter device (100) according to an eighth aspect, in the first region (region A1), the tip end portion (61) of at least one first electrode finger (6) in the plurality of first electrode fingers (6) includes the first wide portion (62). The width of the first wide portion (62) is wider than the width (W60) of the central portion (60) of at least one first electrode finger (6). In the second region (region A2), the tip end portion (71) of at least one second electrode finger (7) in the plurality of second electrode fingers (7) includes the second wide portion (72). The width of the second wide portion (72) is wider than the width (W70) of the central portion (70) of at least one second electrode finger (7).

According to this aspect, the tip end portion (61) of at least one first electrode finger (6) in the plurality of first electrode fingers (6) includes the first wide portion (62). In this manner, the acoustic velocity in the first region (region A1) can be lower than the acoustic velocity in the central region (region A0). In addition, according to this aspect, the tip end portion (71) of at least one second electrode finger (7) in the plurality of second electrode fingers (7) includes the second wide portion (72). In this manner, the acoustic velocity in the second region (region A2) can be lower than the acoustic velocity in the central region (region A0).

In the acoustic wave filter device (100; 100B) according to a ninth aspect, in any one of the first to eighth aspects, the piezoelectric substrate (2) includes the support substrate (211), the high acoustic velocity film (212), the low acoustic velocity film (213), and the piezoelectric body layer (214). The high acoustic velocity film (212) is provided on the support substrate (211). The low acoustic velocity film (213) is provided on the high acoustic velocity film (212). The piezoelectric body layer (214) is provided on the low acoustic velocity film (213). The high acoustic velocity film (212) is a film in which the acoustic velocity of the bulk wave propagating through the high acoustic velocity film (212) is higher than the acoustic velocity of the bulk wave propagating through the piezoelectric body layer (214). The low acoustic velocity film (213) is a film in which the acoustic velocity of the bulk wave propagating through the low acoustic velocity film (213) is lower than the acoustic velocity of the bulk wave propagating through the piezoelectric body layer (214).

According to this aspect, satisfactory main mode characteristics are obtained, and a level of the ripple caused by a transverse mode is relatively lowered.

In the acoustic wave filter device (100; 100B) according to a tenth aspect, in any one of the first to eighth aspects, the piezoelectric substrate (2) includes the silicon substrate, the silicon nitride film, the silicon oxide film, and the piezoelectric body layer (214). The silicon nitride film is provided on the silicon substrate. The silicon oxide film is provided on the silicon nitride film. The piezoelectric body layer (214) is provided on the silicon oxide film. A material of the piezoelectric body layer (214) includes lithium tantalate or lithium niobate.

According to this aspect, satisfactory main mode characteristics are obtained, and a level of the ripple caused by a transverse mode is relatively lowered.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:

a plurality of acoustic wave resonators each including:

a piezoelectric substrate; and an IDT electrode on the piezoelectric substrate;

the IDT electrode includes:

a first busbar;

a second busbar facing the first busbar in a predetermined direction;

a plurality of first electrode fingers extending from the first busbar toward the second busbar in the predetermined direction; and a plurality of second electrode fingers extending from the second busbar toward the first busbar in the predetermined direction;

a region between an envelope of tip edges of the plurality of first electrode fingers and an envelope of tip edges of the plurality of second electrode fingers is defined as an intersecting region;

a wavelength of an acoustic wave determined by an electrode finger pitch of the IDT electrode is defined as λ;

in a plan view in a thickness direction of the piezoelectric substrate, each of the plurality of acoustic wave resonators includes:

a central region including a central portion of the intersecting region of the IDT electrode in the predetermined direction;

a first region including tip end portions of the plurality of first electrode fingers and having a lower acoustic velocity of an acoustic wave than that of the central region; and a second region including tip end portions of the plurality of second electrode fingers and having a lower acoustic velocity of an acoustic wave than that of the central region;

the plurality of acoustic wave resonators include:

a first acoustic wave resonator; and a second acoustic wave resonator;

the piezoelectric substrate of the first acoustic wave resonator and the piezoelectric substrate of the second acoustic wave resonator are the same;

the first acoustic wave resonator further includes:

a third region having a gap having a length of about 0.3λ or longer and less than 2.0λ in the predetermined direction outside of the first region in the predetermined direction and having a higher acoustic velocity of an acoustic wave than that of the central region; and a fourth region having a gap having a length of about 0.3λ or longer and less than 2.0λ in the predetermined direction outside of the second region in the predetermined direction and having a higher acoustic velocity of an acoustic wave than that of the central region; and the second acoustic wave resonator does not include the third region and the fourth region.

2. The acoustic wave filter device according to claim 1, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the first acoustic wave resonators; and the at least two first acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

3. The acoustic wave filter device according to claim 2, wherein at least a portion of a frequency band between a resonant frequency and an anti-resonant frequency of the at least two first acoustic wave resonators is included in a pass band of the acoustic wave filter device.

4. The acoustic wave filter device according to claim 1, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the second acoustic wave resonators; and the at least two second acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

5. The acoustic wave filter device according to claim 1, wherein the first region includes a first mass addition film overlapping at least a portion of the tip end portion of at least one first electrode finger in the plurality of first electrode fingers;

the second region includes a second mass addition film overlapping at least a portion of the tip end portion of at least one second electrode finger in the plurality of second electrode fingers;

the tip end portions of the plurality of first electrode fingers are portions including the tip edge of the first electrode finger; and the tip end portions of the plurality of second electrode fingers are portions including the tip edge of the second electrode finger.

6. The acoustic wave filter device according to claim 1, wherein in the first region, the tip end portion of at least one first electrode finger in the plurality of first electrode fingers includes a first wide portion;

a width of the first wide portion is wider than a width of the central portion of the at least one first electrode finger;

in the second region, the tip end portion of at least one second electrode finger in the plurality of second electrode fingers includes a second wide portion; and a width of the second wide portion is wider than a width of the central portion of the at least one second electrode finger.

7. The acoustic wave filter device according to claim 1, wherein the piezoelectric substrate includes:

a support substrate;

a high acoustic velocity film on the support substrate;

a low acoustic velocity film in the high acoustic velocity film; and a piezoelectric body layer on the low acoustic velocity film;

the high acoustic velocity film is a film in which an acoustic velocity of a bulk wave propagating through the high acoustic velocity film is higher than an acoustic velocity of a bulk wave propagating through the piezoelectric body layer; and the low acoustic velocity film is a film in which an acoustic velocity of a bulk wave propagating through the low acoustic velocity film is lower than an acoustic velocity of a bulk wave propagating through the piezoelectric body layer.

8. The acoustic wave filter device according to claim 1, wherein the piezoelectric substrate includes:

a silicon substrate;

a silicon nitride film on the silicon substrate;

a silicon oxide film on the silicon nitride film; and a piezoelectric body layer on the silicon oxide film; and a material of the piezoelectric body layer includes lithium tantalate or lithium niobate.

9. An acoustic wave filter device comprising:

a plurality of acoustic wave resonators each including:

a piezoelectric substrate; and an IDT electrode on the piezoelectric substrate;

the IDT electrode includes:

a first busbar;

a second busbar facing the first busbar in a predetermined direction;

a plurality of first electrode fingers extending from the first busbar toward the second busbar in the predetermined direction; and a plurality of second electrode fingers extending from the second busbar toward the first busbar in the predetermined direction;

a region between an envelope of tip edges of the plurality of first electrode fingers and an envelope of tip edges of the plurality of second electrode fingers is defined as an intersecting region;

a wavelength of an acoustic wave determined by an electrode finger pitch of the IDT electrode is defined as λ;

in a plan view in a thickness direction of the piezoelectric substrate, each of the plurality of acoustic wave resonators includes:

a central region including a central portion of the intersecting region of the IDT electrode in the predetermined direction;

a first region including tip end portions of the plurality of first electrode fingers and including a first mass addition film overlapping at least a portion of the tip end portion of at least one first electrode finger in the plurality of first electrode fingers; and a second region including tip end portions of the plurality of second electrode fingers and including a second mass addition film overlapping at least a portion of the tip end portion of at least one second electrode finger in the plurality of second electrode fingers;

the tip end portion of the plurality of first electrode fingers is a portion including the tip edge of the first electrode finger;

the tip end portion of the plurality of second electrode fingers is a portion including the tip edge of the second electrode finger;

the plurality of acoustic wave resonators include:

a first acoustic wave resonator; and a second acoustic wave resonator;

the piezoelectric substrate of the first acoustic wave resonator and the piezoelectric substrate of the second acoustic wave resonator are the same;

the first acoustic wave resonator further includes:

a third region having a gap having a length of about 0.3λ or longer and less than 2.0λ in the predetermined direction outside of the first region in the predetermined direction; and a fourth region having a gap having a length of about 0.3λ or longer and less than 2.0λ in the predetermined direction outside of the second region in the predetermined direction; and the second acoustic wave resonator does not include the third region and the fourth region.

10. The acoustic wave filter device according to claim 9, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the first acoustic wave resonators; and the at least two first acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

11. The acoustic wave filter device according to claim 9, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the second acoustic wave resonators; and the at least two second acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

12. The acoustic wave filter device according to claim 10, wherein at least a portion of a frequency band between a resonant frequency and an anti-resonant frequency of the at least two first acoustic wave resonators is included in a pass band of the acoustic wave filter device.

13. The acoustic wave filter device according to claim 9, wherein in the first region, the tip end portion of at least one first electrode finger in the plurality of first electrode fingers includes a first wide portion;

a width of the first wide portion is wider than a width of the central portion of the at least one first electrode finger;

in the second region, the tip end portion of at least one second electrode finger in the plurality of second electrode fingers includes a second wide portion; and a width of the second wide portion is wider than a width of the central portion of the at least one second electrode finger.

14. The acoustic wave filter device according to claim 9, wherein the piezoelectric substrate includes:

a support substrate;

a high acoustic velocity film on the support substrate;

a low acoustic velocity film in the high acoustic velocity film; and a piezoelectric body layer on the low acoustic velocity film;

the high acoustic velocity film is a film in which an acoustic velocity of a bulk wave propagating through the high acoustic velocity film is higher than an acoustic velocity of a bulk wave propagating through the piezoelectric body layer; and the low acoustic velocity film is a film in which an acoustic velocity of a bulk wave propagating through the low acoustic velocity film is lower than an acoustic velocity of a bulk wave propagating through the piezoelectric body layer.

15. The acoustic wave filter device according to claim 9, wherein the piezoelectric substrate includes:

a silicon substrate;

a silicon nitride film on the silicon substrate;

a silicon oxide film on the silicon nitride film; and a piezoelectric body layer on the silicon oxide film; and a material of the piezoelectric body layer includes lithium tantalate or lithium niobate.

16. An acoustic wave filter device comprising:

a plurality of acoustic wave resonators each including:

a piezoelectric substrate; and an IDT electrode on the piezoelectric substrate;

the IDT electrode includes:

a first busbar;

a second busbar facing the first busbar in a predetermined direction;

a plurality of first electrode fingers extending from the first busbar toward the second busbar in the predetermined direction; and a plurality of second electrode fingers extending from the second busbar toward the first busbar in the predetermined direction;

a region between an envelope of tip edges of the plurality of first electrode fingers and an envelope of tip edges of the plurality of second electrode fingers is defined as an intersecting region;

a wavelength of an acoustic wave determined by an electrode finger pitch of the IDT electrode is defined as λ;

in a plan view in a thickness direction of the piezoelectric substrate, each of the plurality of acoustic wave resonators includes:

a central region including a central portion of the intersecting region of the IDT electrode in the predetermined direction;

a first region including tip end portions of the plurality of first electrode fingers, the tip end portion of at least one first electrode finger in the plurality of first electrode fingers including a first wide portion; and a second region including tip end portions of the plurality of second electrode fingers, the tip end portion of at least one second electrode finger in the plurality of second electrode fingers including a second wide portion;

a width of the first wide portion is wider than a width of the central portion of the at least one first electrode finger;

a width of the second wide portion is wider than a width of the central portion of the at least one second electrode finger;

the plurality of acoustic wave resonators include:

a first acoustic wave resonator; and a second acoustic wave resonator;

the piezoelectric substrate of the first acoustic wave resonator and the piezoelectric substrate of the second acoustic wave resonator are the same;

the first acoustic wave resonator further includes:

a third region having a gap having a length of about 0.3λ or longer and less than 2.0λ in the predetermined direction outside of the first region in the predetermined direction; and a fourth region having a gap having a length of about 0.3λ or longer and less than 2.0λ in the predetermined direction outside of the second region in the predetermined direction; and the second acoustic wave resonator does not include the third region and the fourth region.

17. The acoustic wave filter device according to claim 16, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the first acoustic wave resonators; and the at least two first acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

18. The acoustic wave filter device according to claim 17, wherein at least a portion of a frequency band between a resonant frequency and an anti-resonant frequency of the at least two first acoustic wave resonators is included in a pass band of the acoustic wave filter device.

19. The acoustic wave filter device according to claim 16, further comprising:

a first input-output electrode; and a second input-output electrode; wherein the plurality of acoustic wave resonators include:

two or more acoustic wave resonators provided in a signal path between the first input-output electrode and the second input-output electrode; and two or more acoustic wave resonators connected between the signal path and a ground;

the plurality of acoustic wave resonators include at least two of the second acoustic wave resonators; and the at least two second acoustic wave resonators include:

an acoustic wave resonator having a largest electrode finger pitch in the two or more acoustic wave resonators provided in the signal path; and an acoustic wave resonator having a smallest electrode finger pitch in the two or more acoustic wave resonators connected between the signal path and the ground.

* * * * *